United States Patent
Nishihara

(10) Patent No.: US 10,730,193 B2
(45) Date of Patent: Aug. 4, 2020

(54) CUTTER

(71) Applicant: Kyocera Corporation, Kyoto-shi, Kyoto (JP)

(72) Inventor: Takanori Nishihara, Takatsuki (JP)

(73) Assignee: KYOCERA CORPORATION, Kyoto-shi, Kyoto (JP)

(*) Notice: Subject to any disclaimer, the term of this patent is extended or adjusted under 35 U.S.C. 154(b) by 0 days.

(21) Appl. No.: 15/556,658

(22) PCT Filed: Jun. 22, 2016

(86) PCT No.: PCT/JP2016/068583
§ 371 (c)(1),
(2) Date: Sep. 8, 2017

(87) PCT Pub. No.: WO2016/208646
PCT Pub. Date: Dec. 29, 2016

(65) Prior Publication Data
US 2018/0050434 A1    Feb. 22, 2018

(30) Foreign Application Priority Data

| Jun. 22, 2015 | (JP) | ................. | 2015-124612 |
| Feb. 15, 2016 | (JP) | ................. | 2016-025987 |
| Feb. 19, 2016 | (JP) | ................. | 2016-029788 |

(51) Int. Cl.
*B26B 9/00*  (2006.01)
*B23K 26/34*  (2014.01)
(Continued)

(52) U.S. Cl.
CPC ............. *B26B 9/00* (2013.01); *B23K 26/34* (2013.01); *B24B 3/54* (2013.01); *B26D 1/0006* (2013.01); *C23C 16/22* (2013.01)

(58) Field of Classification Search
CPC ........................................................ B26B 9/00
(Continued)

(56) References Cited

U.S. PATENT DOCUMENTS 3,553,905 A * 1/1971 Lemelson ............ B23B 27/148
                                                  125/15
5,588,419 A * 12/1996 Elsbree .................... B24D 5/12
                                                  125/15
(Continued)

FOREIGN PATENT DOCUMENTS

CA      2371608 A1 * 11/2000 ............ B23K 20/08
DE  102012206248     * 10/2013
(Continued)

OTHER PUBLICATIONS

English Translation of JP01127272.*
(Continued)

*Primary Examiner* — Jennifer B Swinney
(74) *Attorney, Agent, or Firm* — Viering, Jentschura & Partner MBB

(57) ABSTRACT

A cutter according to one embodiment of the present disclosure includes a blade body that includes a base body portion and a cutting edge portion disposed along an end portion of the base body portion and connected to the end portion. The base body portion contains a first metal. The cutting edge portion contains a second metal and a plurality of hard particles having hardness higher than that of the second metal. A cutter according to another embodiment of the present disclosure includes a blade body that includes a base body portion and a cutting edge portion disposed along an end portion of the base body portion and connected to the end portion. The base body portion contains a first metal as
(Continued)

a primary component. The cutting edge portion contains, as a primary component, a second metal having hardness lower than that of the first metal.

19 Claims, 23 Drawing Sheets

(51) Int. Cl.
B24B 3/54 (2006.01)
B26D 1/00 (2006.01)
C23C 16/22 (2006.01)
(58) Field of Classification Search
USPC .......................................... 30/345, 350, 357
See application file for complete search history.

(56) References Cited

U.S. PATENT DOCUMENTS

| | | | | |
|---|---|---|---|---|
| 6,067,784 | A * | 5/2000 | Jordan | B23D 35/001 30/345 |
| 6,195,899 | B1 | 3/2001 | Watanabe | |
| 6,447,569 | B1 | 9/2002 | Sueta | |
| 8,601,907 | B2 * | 12/2013 | Lewis | B22F 3/225 76/104.1 |
| 2003/0148723 | A1 * | 8/2003 | Wildenburg | B24D 5/123 451/541 |
| 2006/0090603 | A1 | 5/2006 | Lewis et al. | |
| 2006/0166615 | A1 * | 7/2006 | Tank | B22F 7/06 451/540 |
| 2007/0006683 | A1 * | 1/2007 | Howells | B26B 9/00 76/104.1 |
| 2007/0163128 | A1 | 7/2007 | Tarrerias | |
| 2009/0194203 | A1 * | 8/2009 | Hirai | B26B 9/00 148/226 |
| 2009/0241352 | A1 * | 10/2009 | Sueda | B26B 9/00 30/350 |
| 2010/0071216 | A1 * | 3/2010 | Novak | B26B 9/00 30/162 |
| 2010/0083795 | A1 * | 4/2010 | Eggert | C21D 1/18 81/52 |
| 2010/0218389 | A1 * | 9/2010 | Kalomeris | B23D 61/128 30/392 |
| 2012/0060379 | A1 * | 3/2012 | Culf | B23P 15/40 30/350 |
| 2013/0133209 | A1 | 5/2013 | Sueda | |
| 2013/0233145 | A1 | 9/2013 | Sotelo et al. | |
| 2014/0227952 | A1 * | 8/2014 | Tholin | B24D 3/08 451/541 |
| 2015/0090090 | A1 * | 4/2015 | Jere | B23D 61/125 83/669 |

FOREIGN PATENT DOCUMENTS

| | | | | |
|---|---|---|---|---|
| EP | 2387873 A1 * | 11/2011 | | A01D 34/73 |
| GB | 261166 A * | 11/1926 | | B21K 11/02 |
| GB | 1299640 A * | 12/1972 | | B28D 1/127 |
| JP | S628778 A | 1/1987 | | |
| JP | 01127272 A * | 5/1989 | | |
| JP | 08155153 A * | 6/1996 | | B26B 9/00 |
| JP | H08155153 A | 6/1996 | | |
| JP | 09276565 A * | 10/1997 | | B22F 7/06 |
| JP | 2000189682 A | 7/2000 | | |
| JP | 2000197779 A * | 7/2000 | | B26B 9/00 |
| JP | 2001025585 A | 1/2001 | | |
| JP | 2001198876 A | 7/2001 | | |
| JP | 2004358069 A | 12/2004 | | |
| JP | 2007524520 A | 8/2007 | | |
| JP | 3174409 U | 3/2012 | | |
| JP | 2012066070 A | 4/2012 | | |

OTHER PUBLICATIONS

English Translation of JP 08155153.*
Azom. "Colbalt (Co)-Properties, Applications", Jul. 12, 2013 [online], [retrieved on Nov. 22, 2019]. Retrieve from Internet <URL: https://www.azom.com/article.aspx?ArticleID=9077>. (Year: 2013).*
Azom. "AISI 1045 Medium Carbon Steel", Jul. 5, 2012 [online], [retrieved on Nov. 22, 2019]. Retrieve from Internet <URL: https://www.azom.com/article.aspx?ArticleID=6130>. (Year: 2012).*
International Search Report based on Application No. PCT/JP2016/068583 (5 pages) dated Sep. 13, 2016 (Reference Purpose Only).

* cited by examiner

CUTTER

RELATED APPLICATIONS

The present application is a national stage entry according to 35 U.S.C. 371 of PCT application No.: PCT/JP2016/068583 filed on Jun. 22, 2016, which claims priority from Japanese application No.: 2015-124612 filed on Jun. 22, 2015, Japanese application No.: 2016-025987 filed on Feb. 15, 2016, and Japanese application No.: 2016-029788 filed on Feb. 19, 2016, which are incorporated herein by reference in their entirety.

TECHNICAL FIELD

The present disclosure is related to a cutter.

BACKGROUND ART

A kitchen knife made of a material containing a metal material as a primary component has been conventionally used. Particularly, a kitchen knife made of stainless steel containing nickel and chromium as components has been often used recently (see Patent Document 1). A kitchen knife made of zirconia ceramics, which is very different from a stainless-steel kitchen knife, has also been known (see Patent Document 2).

CITATION LIST

Patent Literature

Patent Document 1: JP 2000-189682 A
Patent Document 2: JP 2004-358069 A

SUMMARY OF INVENTION

A cutter according to one embodiment of the present disclosure includes a blade body that includes a base body portion and a cutting edge portion disposed along an end portion of the base body portion and connected to the end portion. The base body portion contains a first metal. The cutting edge portion contains a second metal and a plurality of hard particles having hardness higher than that of the second metal.

A cutter according to another embodiment of the present disclosure includes a blade body that includes a base body portion and a cutting edge portion disposed along an end portion of the base body portion and connected to the end portion. The base body portion contains a first metal as a primary component. The cutting edge portion contains, as a primary component, a second metal having hardness lower than that of the first metal.

A cutter according to another embodiment of the present disclosure includes a base body portion that includes an end portion and a back portion and a cutting edge portion disposed along the end portion of the base body portion and connected to the end portion. The base body portion includes a first region, a second region, and a third region in an order from the back portion to the cutting edge portion. The second region has hardness lower than those of the first region and third region. The third region has hardness higher than that of the first region.

A cutter according to another embodiment of the present disclosure includes a blade body that includes a base body portion and a cutting edge portion that is connected to the base body portion and contains a material different from that of the base body portion. The blade body includes a cutting edge and a pair of side surfaces located on both sides of the cutting edge. The pair of side surfaces of the blade body each include a first inclined region that is inclined to a vertical direction at a first inclination angle and a second inclined region that is inclined to the vertical direction at a second inclination angle smaller than the first inclination angle. The first inclined region is located closer to a cutting edge side than the second inclined region is. The cutting edge portion includes the whole of the first inclined region and a part of the second inclined region.

BRIEF DESCRIPTION OF DRAWINGS

FIGS. 18A and 18B are enlarged cross-sectional views of the region Zm in FIG. 3.

FIG. 21A is an image of a cross section in the vicinity of a cutting end portion observed by a scanning electron microscope. FIG. 21B is an image of a side surface in the vicinity of the cutting end portion observed by the scanning electron microscope.

DESCRIPTION OF EMBODIMENTS

Figure 1:
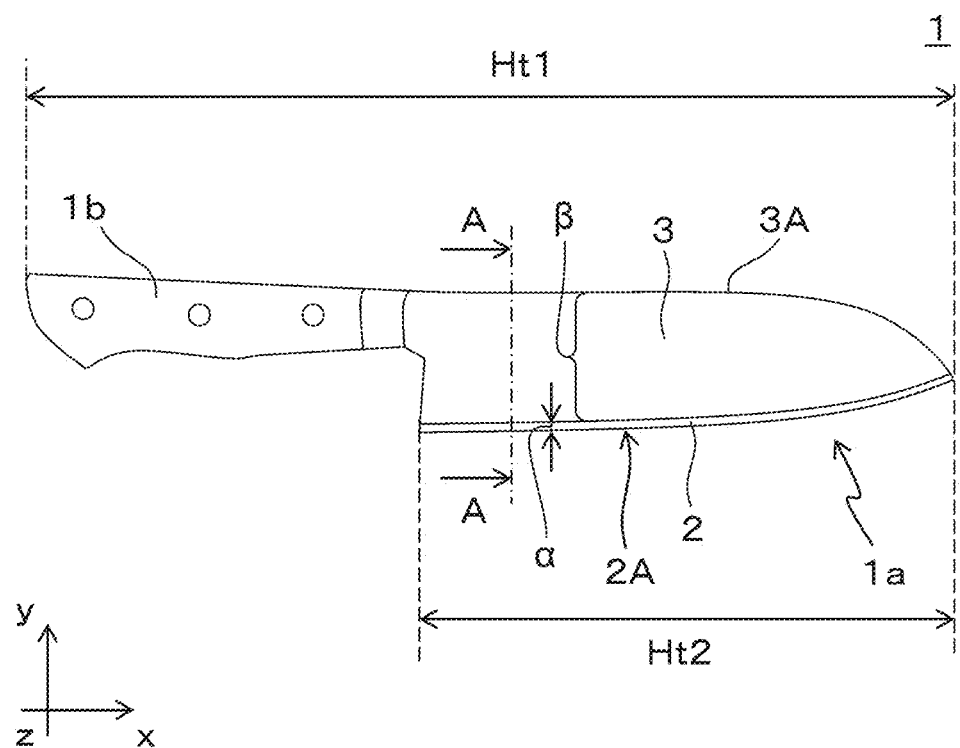
FIG. 1 is a plan view of a cutter according to an embodiment of the present disclosure.

Hereinafter, embodiments of a cutter and a method for manufacturing the cutter are described with reference to the drawings. The drawings used in the following description are schematically illustrated. The dimensions in the drawings may not be necessarily the same as actual dimensions.
Overall Configuration of Cutter A cutter of the present disclosure is described below. A cutter 1 of the present disclosure includes a blade body 1a and a handle 1b connected to the blade body 1a.

The blade body 1a has a shape and size set according to the use of the cutter 1. If the cutter 1 is a kitchen knife, examples of the shape of the blade body 1a include Japanese kitchen knives such as a broad-bladed kitchen knife and an all-purpose kitchen knife, Western kitchen knives such as a butcher knife, and Chinese kitchen knives. If the cutter 1 is used in applications other than as a kitchen knife, e.g., as a knife or a surgical instrument, the cutter 1 can have any shape according to the use.

The handle 1b connected to the blade body 1a is configured to be held by a person who uses the cutter 1. Similar to the blade body 1a, the handle 1b has a shape and size set according to the use of the cutter 1.

The blade body 1a and the handle 1b may be integrally or separately formed. The cutter 1 may not include the handle 1b and may be formed only by the blade body 1a. In the present embodiment, the blade body 1a and the handle 1b are separately formed. A part of the blade body 1a is inserted in the handle 1b and is fixed to the handle 1b at the insertion portion.

The handle 1b contains a wood, resin, ceramic, or metal material. A rust-resistant material, such as a titanium-based material and a stainless steel-based material, may be used as the metal material. For example, an ABS resin (acrylonitrile-butadiene-styrene copolymer) or a polypropylene resin may be used as the resin.

The cutter 1 can have any dimensions, but an example of the dimensions of the cutter 1 is illustrated for reference. A total length (in x-axis direction) Ht1 illustrated in FIGS. 1 and 2 may be set to greater than or equal to 5 cm and less than or equal to 40 cm. A total length (in the x-axis direction) Ht2 of a cutting edge portion 2, which will be described below, illustrated in FIGS. 1 and 2 may be set to greater than or equal to 2 cm and less than or equal to 35 cm. A length Ht3 in a width direction (y-axis direction), which is orthogonal to the total length Ht1 of the blade body 1a, illustrated in FIG. 3 may be set to greater than or equal to 10 mm and less than or equal to 150 mm. A thickness (in z-axis direction) Ht4 of the blade body 1a illustrated in FIG. 3 may be set to, for example, greater than or equal to 1 mm and less than or equal to 5 mm at a portion with the greatest thickness. A length (in the x-axis direction) of the handle 1b and a thickness (in the z-axis direction) of the handle 1b can also be set as appropriate. For example, the thickness of the handle 1b may be set to greater than or equal to 5 mm and less than or equal to 3 cm.
Blade Body The blade body 1a includes a base body portion 3 and the cutting edge portion 2 connected to the base body portion 3.

The base body portion 3 contains a first metal. For example, steel, composite steel, stainless steel, or a titanium alloy may be used as the first metal. As the composite steel, a material that contains chromium, molybdenum, vanadium, tungsten, cobalt, copper, or a combination of these may be used, for example. As the stainless steel, a chromium nickel stainless steel or a chromium stainless steel may be used. As the titanium alloy, a titanium alloy containing 6% of aluminum (Al) and 4% of vanadium (V), which is so-called 64 titanium, may be used, for example. If the first metal is stainless steel, corrosion resistance of the base body portion 3 against rust, for example, can be improved.

In the present embodiment, the first metal is a primary component in the base body portion 3. Here, the primary component refers to a component present in the base body portion 3 in an amount greater than 70 mass % based on a total mass of all components included therein, taken as 100 mass %.

Figure 2:
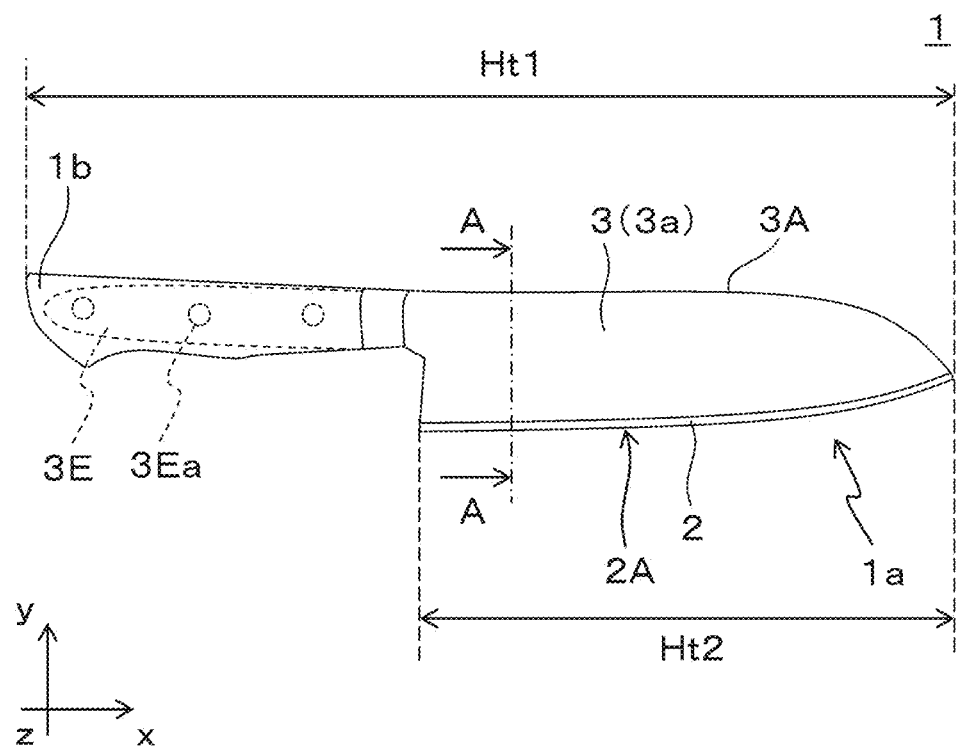
FIG. 2 is a perspective plan view of the cutter in FIG. 1.
Figure 3:
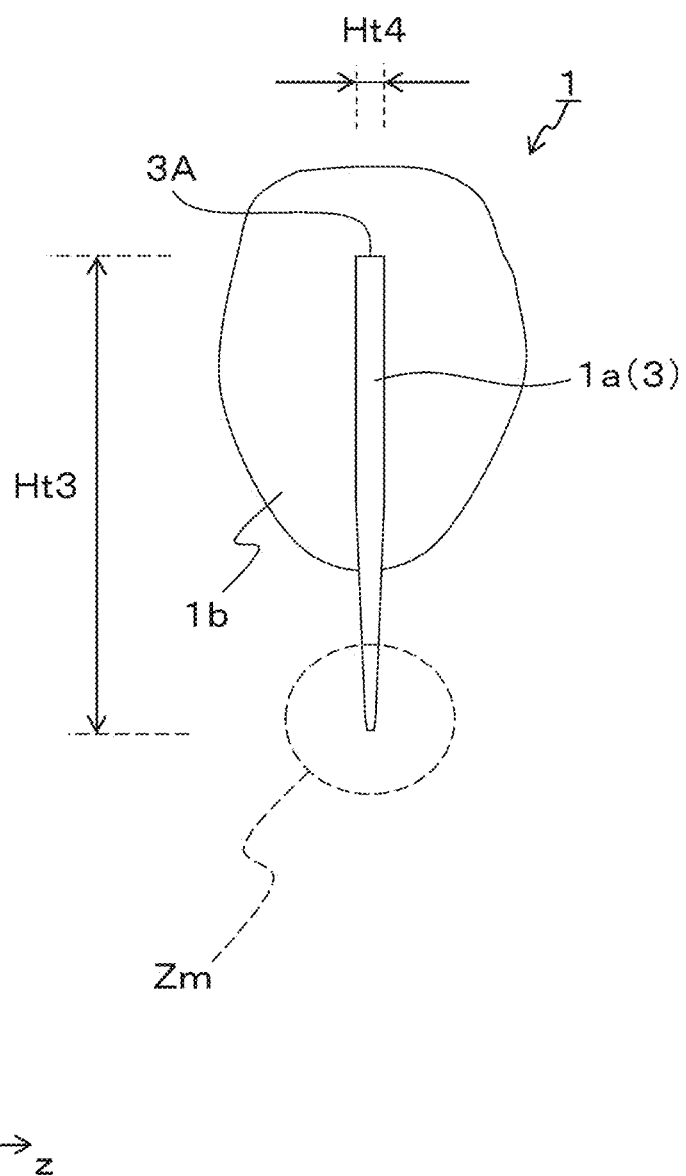
FIG. 3 is a diagram of the cutter in FIG. 1 when viewed from a cutting edge side.

As illustrated in FIG. 2, the base body portion 3 includes an exposed portion exposed from the handle 1b and a core 3E inserted in the handle 1b. The exposed portion includes an end portion 3C and a back portion 3A extending along a length direction (x-axis direction) of the exposed portion. A width of the exposed portion tapers toward the tip in the length direction of the exposed portion. The end portion 3C and the back portion 3A are connected to each other at the tip of the exposed portion. The cutting edge portion 2 is connected to the end portion 3C of the exposed portion along the end portion 3C. The core 3E is narrower than the exposed portion in the width direction (y-axis direction) and inserted in the handle 1b. The core 3E in the present embodiment has one or more hole parts 3Ea. A part of the handle 1b is inserted in the hole part 3Ea, so that the blade body 1a and the handle 1b are firmly fixed together.

The cutting edge portion 2 contains a second metal 2a and a plurality of hard particles 4. The second metal 2a may be made of a material different from that of the first metal or the same material. In the present embodiment, the second metal 2a is made of a material different from that of the first metal. This is advantageous in that a metal material suitable for the cutting edge portion 2 can be selected regardless of the material for the base body portion 3. Nickel, titanium, a nickel alloy, or a titanium alloy may be used as the material for the second metal 2a. An alloy of nickel, chromium, and iron (for example, INCONEL (trade name)), an alloy of nickel, silicon, and boron (for example, COLMONOY (trade name)), or an alloy of titanium, aluminum, and vanadium may be used as the material for the second metal 2a.

When being made of INCONEL, which has relatively high corrosion resistance, residual thermal stress in the cutting edge portion 2 can be reduced when a laser is used in the manufacturing method.

When the second metal 2a is made of Ni-based COLMONOY, a reduction in strength due to quenching and annealing of the cutting edge in manufacturing of the cutter 1 can be suppressed. Ni-based COLMONOY preferably contains carbon at less than or equal to 0.06 mass %, iron at less than or equal to 0.8 mass %, silicon at 2.4 to 3.0 mass %, boron at 1.6 to 2.00 mass %, oxygen at less than or equal to 0.08 mass %, and nickel as the remainder based on the total amount of Ni-based COLMONOY.

In the present embodiment, the second metal 2a included in the cutting edge portion 2 has Vickers hardness lower than that of the first metal included in the base body portion 3. Accordingly, the cutter 1 has the advantages of both the first metal and the second metal 2a. Thus, the first metal can increase the overall strength of the cutter 1. The second metal 2a of the cutting edge portion 2 can reduce occurrence of cracking or chipping in the cutting edge portion 2 due to stress applied through the use of the cutter 1. Durability of the cutting edge portion 2 can be improved.

In the present embodiment, the second metal 2a is a primary component in the cutting edge portion 2. Here, the primary component refers to a component present in the cutting edge portion 2 in an amount greater than 70 mass % based on a total mass of all components included therein, taken as 100 mass %. The second metal 2a is the primary component of the cutting edge portion 2, so that the durability of the cutting edge portion 2 can be further improved.

The plurality of hard particles 4 included in the cutting edge portion 2 have Vickers hardness higher than that of the second metal 2a included in the cutting edge portion 2. This can increase hardness of the entire cutting edge portion 2 and improve wear resistance of the cutting edge portion 2. The hard particles 4 are made of a material harder than the second metal 2a. Accordingly, sharpness of the cutting edge portion 2 against an object is improved because the hard particles 4 contact the object in the use of the cutter 1.

In the present embodiment, the hard particles 4 are made of a material, which is not only harder than the second metal 2a but also harder than the first metal. In this way, the hard particles 4, which have sufficient hardness, are used, which can increase the effects of improving sharpness of the cutting edge portion 2 and improving wear resistance. For example, the hard particles 4 may have Vickers hardness of greater than or equal to 1000 Hv and less than or equal to 4000 Hv.

The hard particles 4 are preferably exposed from a surface of the cutting edge portion 2. Furthermore, the hard particles 4 are preferably distributed in the cutting edge portion 2 not only in the length direction (x-axis direction) and the width direction (y-axis direction) of the base body portion 3 but also in the thickness direction (z-axis direction) of the base body portion 3 such that the hard particles 4 are more likely to be exposed from the surface of the cutting edge portion 2 even if the cutting edge portion 2 is polished.

For example, a cemented carbide alloy that contains tungsten carbide (WC) and cermet that contains titanium carbide (TiC), titanium nitride (TiN), tantalum carbide (TaC), or the like are examples of the hard particles 4. The hard particles 4 may be made of a mixture of a plurality of materials such as tungsten carbide and titanium carbide.

Figure 6:
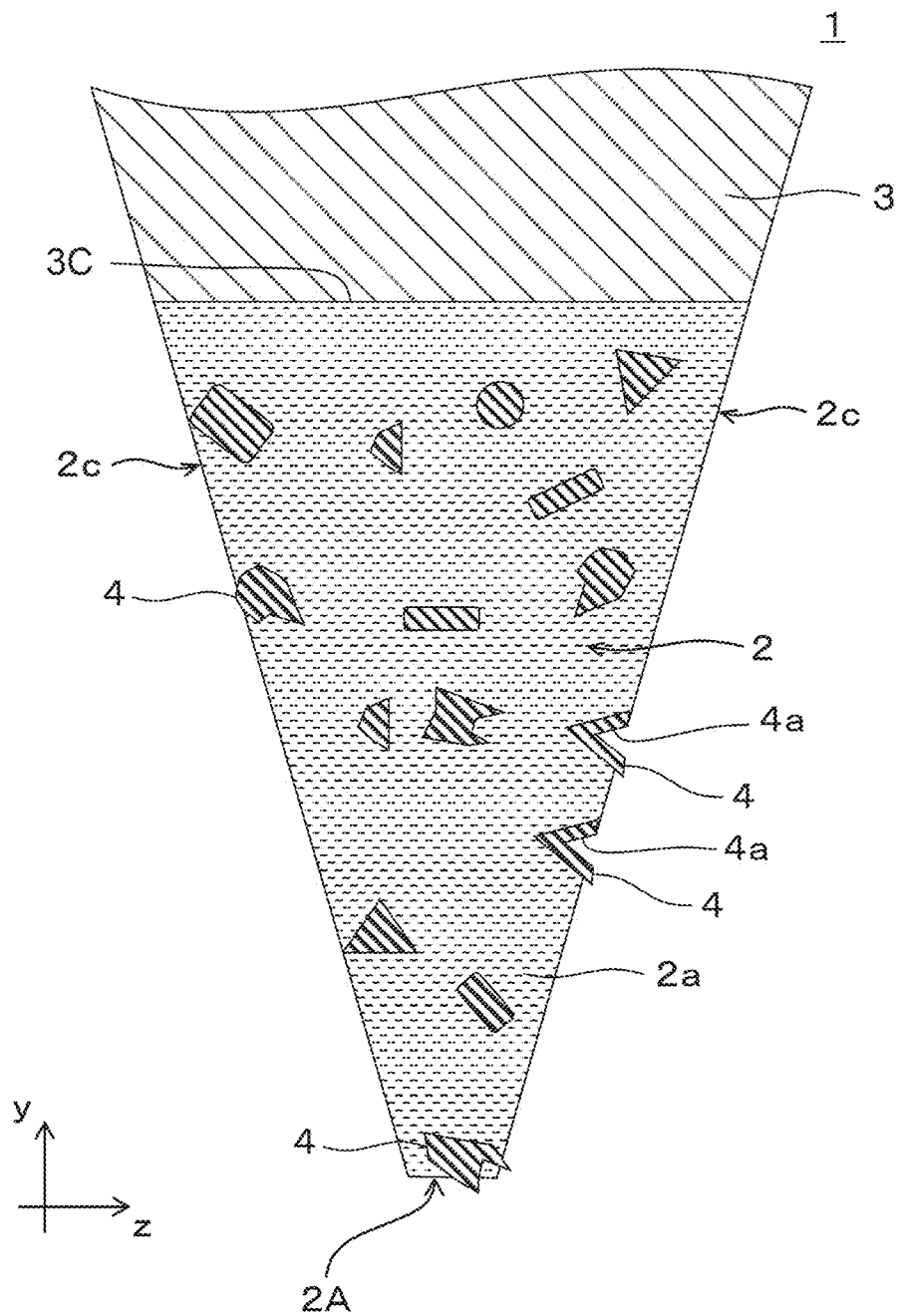
FIG. 6 is a cross-sectional view of a cutter according to another embodiment of the present disclosure.

The hard particles 4 may have any of a variety of shapes. For example, a polygonal shape, such as a triangular shape, a quadrilateral shape, and a trapezoidal shape, and a circular shape, in a cross-sectional view, are examples of the shape of the hard particle 4. A corner portion of the hard particle 4 may be a cut-out portion. In this case, adhesion between the hard particles 4 and the second metal 2a can be improved. Note that the shape of the hard particles 4 is not limited to the illustrated shape and may be an irregular shape. As in the embodiment illustrated in FIG. 6, the hard particles 4 may each have a shape including a recessed portion 4a. In this case, the recessed portions 4a of the hard particles 4 are exposed from side surfaces 2c and a cutting edge 2A, which improves sharpness of the cutting edge portion 2, and further, improves smoothness of the cutter 1 due to a reduced contact area.

The hard particles 4 may have an average particle diameter set to greater than or equal to 5 μm and less than or equal to 50 μm, for example. For such setting, particles having an average particle diameter of less than 5 μm and particles having an average particle diameter exceeding 50 μm may be screened using a screen.

The cutting edge portion 2 may contain greater than or equal to 10 vol. % of the hard particles 4. In this case, sharpness and wear resistance of the cutting edge portion 2 can be further improved. The cutting edge portion 2 may contain less than or equal to 50 vol. % of the hard particles 4. In this case, productivity for the cutting edge portion 2 can be highly maintained. The content of the hard particles 4 is determined as follows. A cross section of the cutting edge portion 2 (cross section parallel to a yz plane) is observed by a scanning electron microscope, and a ratio of a total area of the hard particles 4 to an area of the entire cutting edge portion 2 is determined from the observation image. This is regarded as the volume percentage. Particularly, the volume percentage of the hard particles 4 is computed as follows. First, a cross section of the cutting edge portion 2 is observed at five different places at almost equal intervals along the length direction (x-axis direction) of the cutting edge portion 2. Next, a ratio of an area of the hard particles 4 is measured at the five places. The average of the ratios of the area of the hard particles 4 at the five places is obtained. The average of the ratios of the area is regarded as the volume percentage of the hard particles 4 to thereby compute the volume percentage of the hard particles 4.

Vickers hardness of the hard particles 4, the first metal, and the second metal 2a can be measured by using a method in conformance with JIS Z 2244 (ISO6507-2, the same applies to the following). If the measurement by the method is difficult, the compositions of the hard particles 4, the first metal, and the second metal 2a are identified. Then, samples having almost the same compositions as the identified compositions are created, and the samples are measured by the method in conformance with JIS Z 2244.

In the present disclosure, as long as a relationship in a degree of Vickers hardness among the first metal, the second metal 2a, and the hard particles 4 can be grasped, a difference between the identified composition and the composition of the sample is allowable within the bounds of not substantially affecting the relationship in the degree.

Next, a cross section of the blade body 1a (cross section parallel to the yz plane) is described with reference to FIGS. 4 and 5. The cutting edge portion 2 includes the cutting edge 2A and the pair of side surfaces 2c that are disposed on both sides of the cutting edge 2A and connected to the cutting edge 2A. At least one of the plurality of hard particles 4 is exposed from the side surfaces 2c of the cutting edge portion 2. Accordingly, when an object is cut with the cutter 1, the hard particles 4 contact the object. As a result, sharpness of the cutting edge portion 2 is excellent, and wear resistance of the cutting edge portion 2 can also be improved. In the present embodiment, the plurality of hard particles 4 are exposed from both of the side surfaces 2c of the cutting edge portion 2. Thus, sharpness and wear resistance of the cutting edge portion 2 can be further improved.

Also in the present embodiment, at least one of the hard particles 4 is exposed from the cutting edge 2A. Thus, when an object is cut with the cutter 1, the hard particles 4 exposed from the cutting edge 2A contact the object, and sharpness of the cutting edge 2A can be improved.

Figure 7:
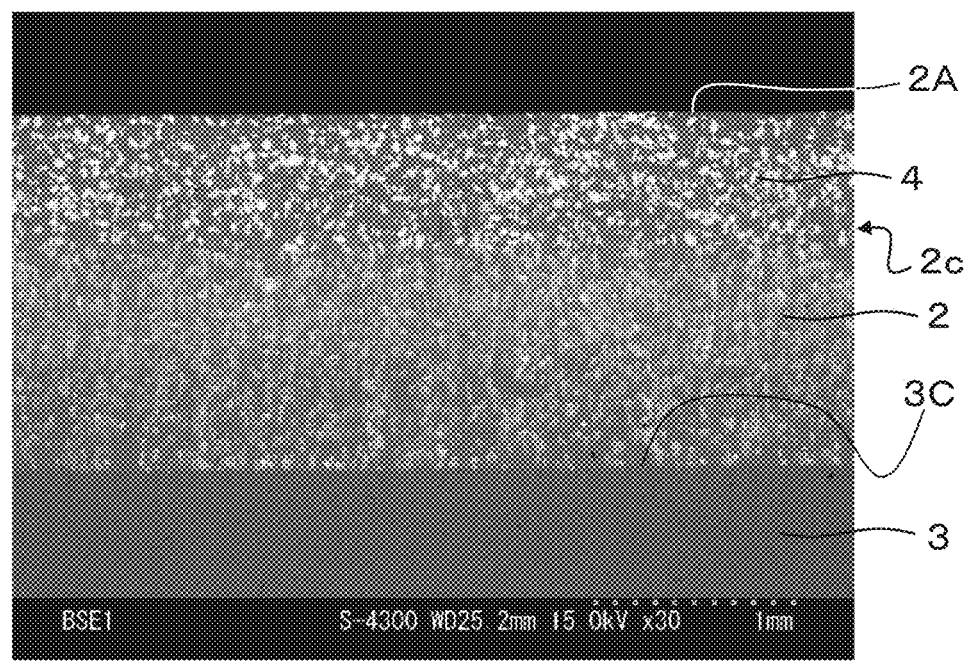
FIG. 7 is an image of a side surface of the cutting edge portion of the cutter in FIG. 1 observed by a scanning electron microscope.
Figure 8:
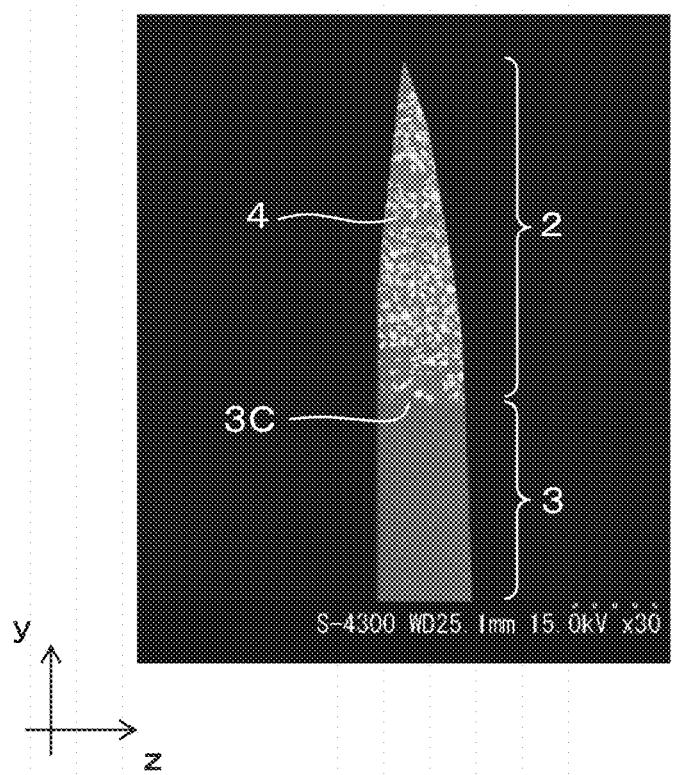
FIG. 8 is an image of a cross section of the cutting edge portion of the cutter in FIG. 11 observed by the scanning electron microscope.

Next, distribution of the hard particles 4 is described with reference to the picture shown in FIG. 7. FIG. 7 is an image of the side surface 2c of the cutting edge portion 2 observed by the scanning electron microscope. In FIG. 7, a portion visually identified as white is a portion in which the hard particle 4 is exposed from the side surface 2c of the cutting edge portion 2. As clearly seen from FIG. 7, in the present embodiment, in the cutting edge portion 2, more hard particles 4 are exposed in a region on the cutting edge 2A side than in a region on the base body portion 3 side. This can increase sharpness and wear resistance of the cutting edge portion 2 in the region on the cutting edge 2A side and improve performance of the cutting edge portion 2. To set the distribution of the exposed hard particles 4 in the above-mentioned manner, polishing (for example, buffing) may be performed such that more second metal 2a is shaved off selectively on the side of the cutting edge 2A than on the base body portion 3 side, in the cutting edge portion 2.

Figure 4:
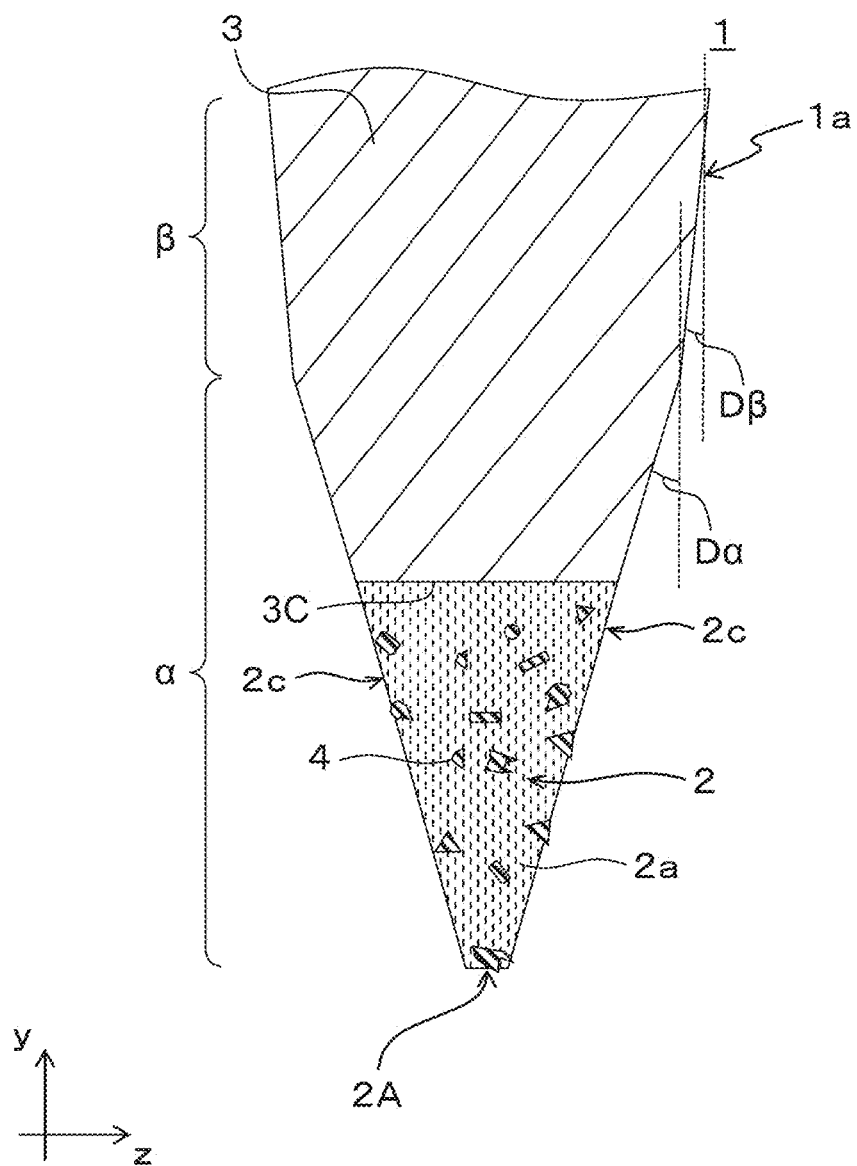
FIG. 4 is an enlarged cross-sectional view of a region Zm in FIG. 3.
Figure 5:
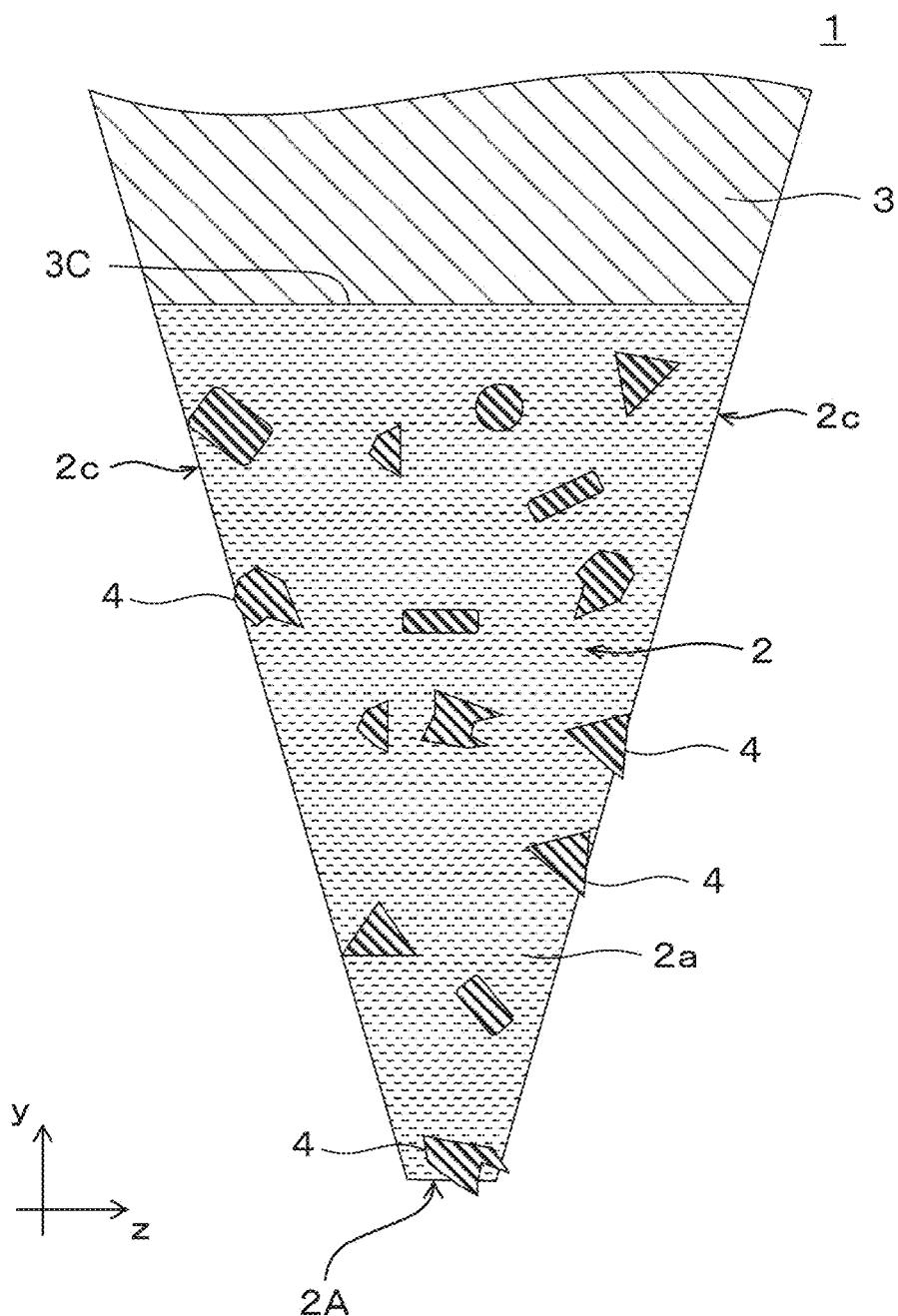
FIG. 5 is an enlarged cross-sectional view of a cutting edge portion side in FIG. 4.

As illustrated in FIG. 4, a width in the thickness direction (z-axis direction) of the blade body 1a tapers toward the cutting edge 2A in the cross section (cross section parallel to the yz plane). The side surfaces of the blade body 1a have different inclination angles with respect to the vertical direction (y-axis direction) between the cutting edge 2A side and the back portion 3A side. Specifically, the side surfaces of the blade body 1a on the cutting edge 2A side have the inclination angle larger than that of the side surfaces thereof on the back portion 3A side.

Here, in the side surfaces of the blade body 1a, a region on the cutting edge 2A side having a large inclination angle is a first inclined region α, a region on the back portion 3A side having a small inclination angle is a second inclined region β, an inclination angle of the side surface of the blade body 1a in the first inclined region α is Dα, and an inclination angle of the side surface of the blade body 1a in the second inclined region β is Dβ. The vertical direction (y-axis direction) is a direction, with the cutting edge 2A being a base point, parallel to a perpendicular line (line parallel to y-axis) orthogonal to the thickness direction (z-axis direction) of the blade body 1a. In the cutter 1 illustrated in FIG. 4, the inclination angle Dα is larger than the inclination angle Dβ. In the present embodiment, the first inclined region α includes not only the side surfaces 2c of the cutting edge portion 2 but also the side surfaces of the base body portion 3, and includes the whole of the side surfaces 2c of the cutting edge portion 2.

A length in the y-axis direction of the first inclined region α can be set to greater than or equal to 0.5 mm and less than or equal to 3 mm, for example. A length in the y-axis direction of the cutting edge portion 2 can be set to be shorter than or equal to the length of the cutting edge region α, and can be set to greater than or equal to 0.2 mm and less than or equal to 2.8 mm, for example.

The end portion 3C of the base body portion 3 connected to the cutting edge portion 2 may be a flat surface. Furthermore, the flat surface may be parallel to the length direction (x-axis direction) of the cutter 1. In this case, as illustrated in FIGS. 4 and 5, the end portion 3C is linear parallel to the z-axis direction in the cross section (cross section parallel to the yz plane) of the blade body 1a.

Figure 9:
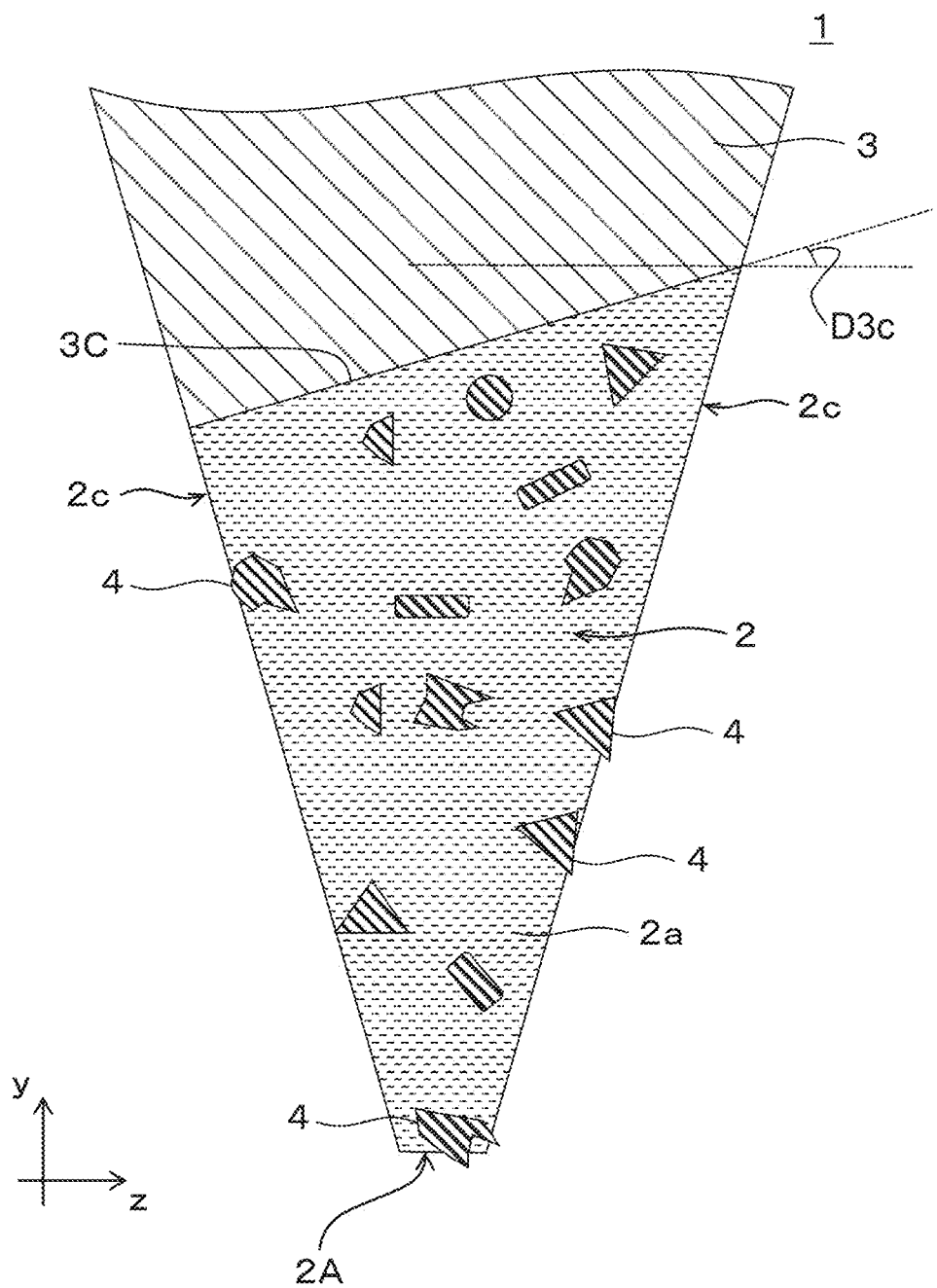
FIG. 9 is a cross-sectional view of a cutter according to another embodiment of the present disclosure.

As illustrated in FIG. 9, the end portion 3C of the base body portion 3 may be inclined to the z-axis direction. In this case, the contact area between the base body portion 3 and the cutting edge portion 2 can be increased, so that adhesion between the base body portion 3 and the cutting edge portion 2 can be improved. An inclination angle D3c with respect to the z-axis direction of the end portion 3C may be set to greater than or equal to 15° and less than or equal to 45°, for example.

Figure 10A:
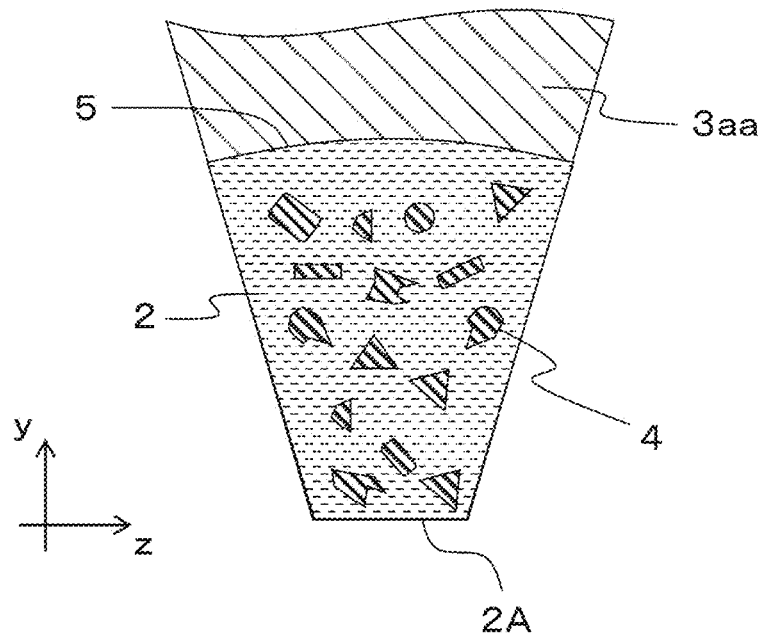
FIGS. 10A and 10B are cross-sectional views of a cutter according to another embodiment of the present disclosure.
Figure 10B:
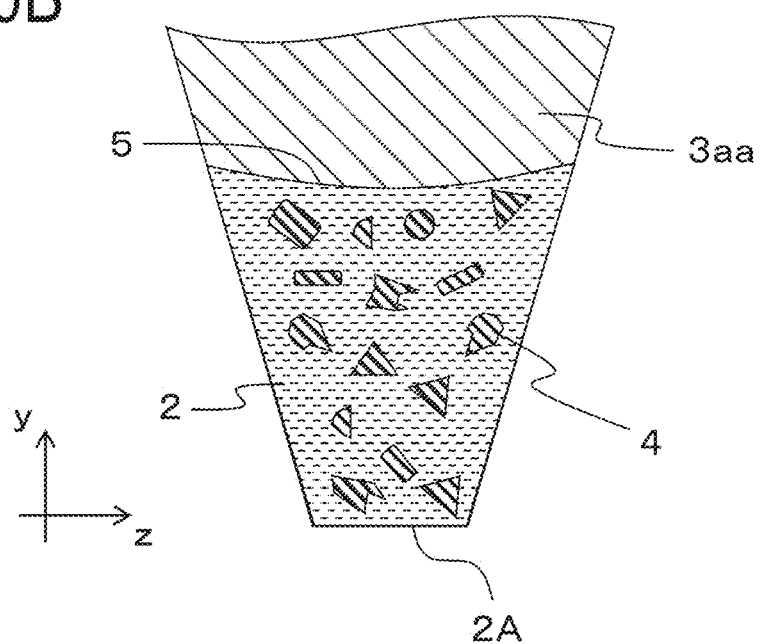

As illustrated in FIG. 10A and FIG. 10B, the end portion 3C of the base body portion 3 may have a curved shape. In this case, the contact area between the base body portion 3 and the cutting edge portion 2 increases. Accordingly, bonding strength between the base body portion 3 and the cutting edge portion 2 increases, and durability of the cutter 1 increases.

Figure 11:
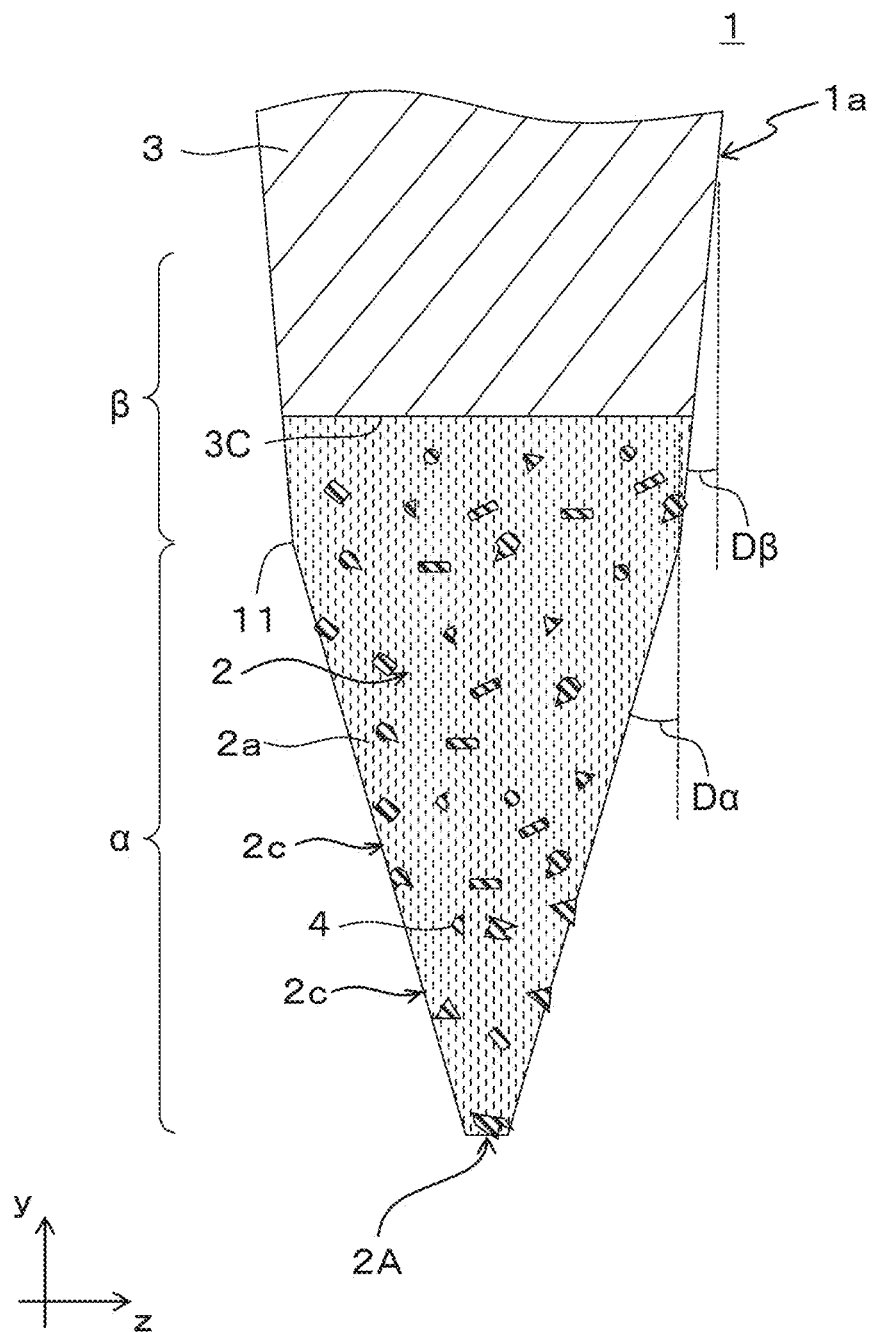
FIG. 11 is a cross-sectional view of a cutter according to another embodiment of the present disclosure.
Figure 12:
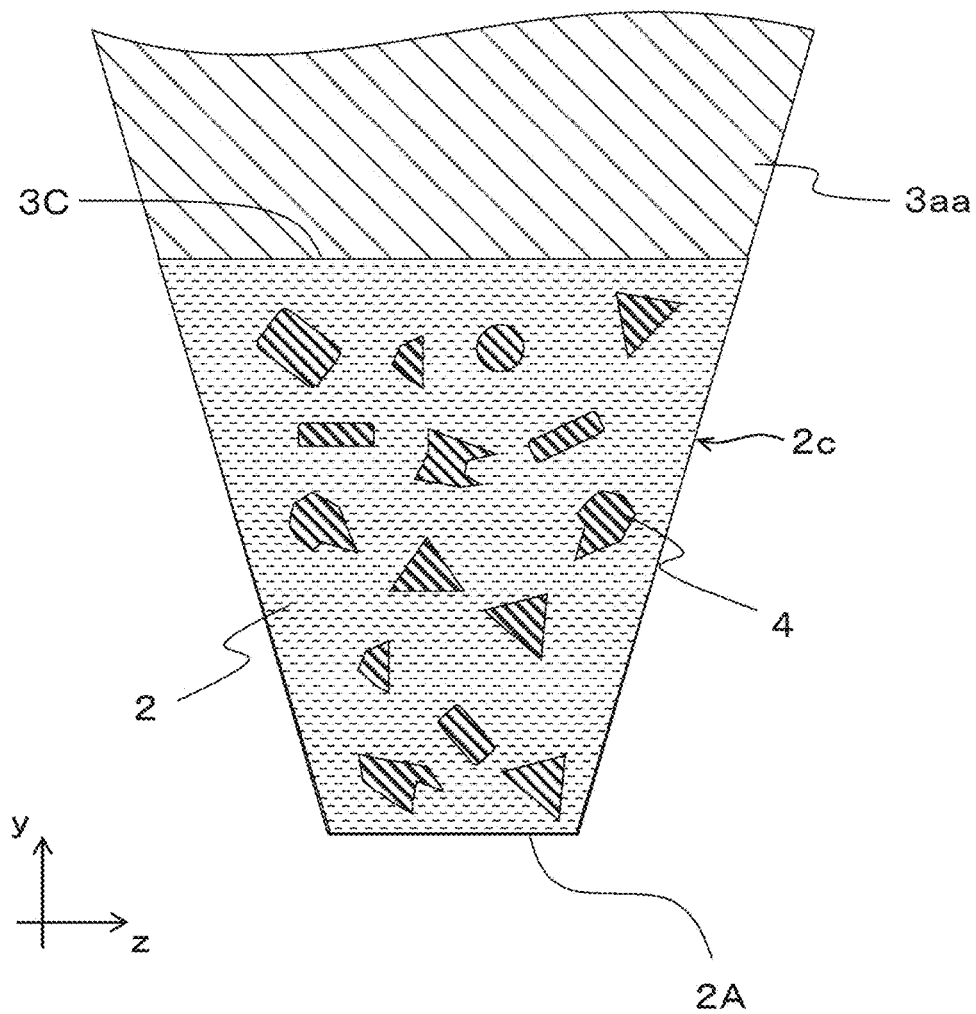
FIG. 12 is a cross-sectional view of a cutter according to another embodiment of the present disclosure.

FIG. 11 illustrates another embodiment of the cutter 1. In the cutter 1, a boundary 11 between the first inclined region α and the second inclined region β is located in the cutting edge portion 2. In other words, the side surfaces 2c of the cutting edge portion 2 include the whole of the first inclined region α and a part of the second inclined region β. In this case, the second inclined region β is in the cutting edge portion 2, so that a sufficient thickness is guaranteed, and resharpening can thus be performed repetitively. As a result, the cutting edge portion 2 can be used for a long period of time.

The inclination angle Dα of the first inclined region α may be set within a range of 10° to 20°, for example. A thickness (length in the z-axis direction) at the end portion 3C of the base body portion 3 may be set to greater than or equal to 0.2 mm and less than or equal to 1 mm, for example. A thickness (length in the z-axis direction) at the cutting edge 2A may be appropriately set according to sharpness of the cutter 1, and may be set to greater than or equal to 0.1 μm and less than or equal to 10 μm, for example.

Figure 13:
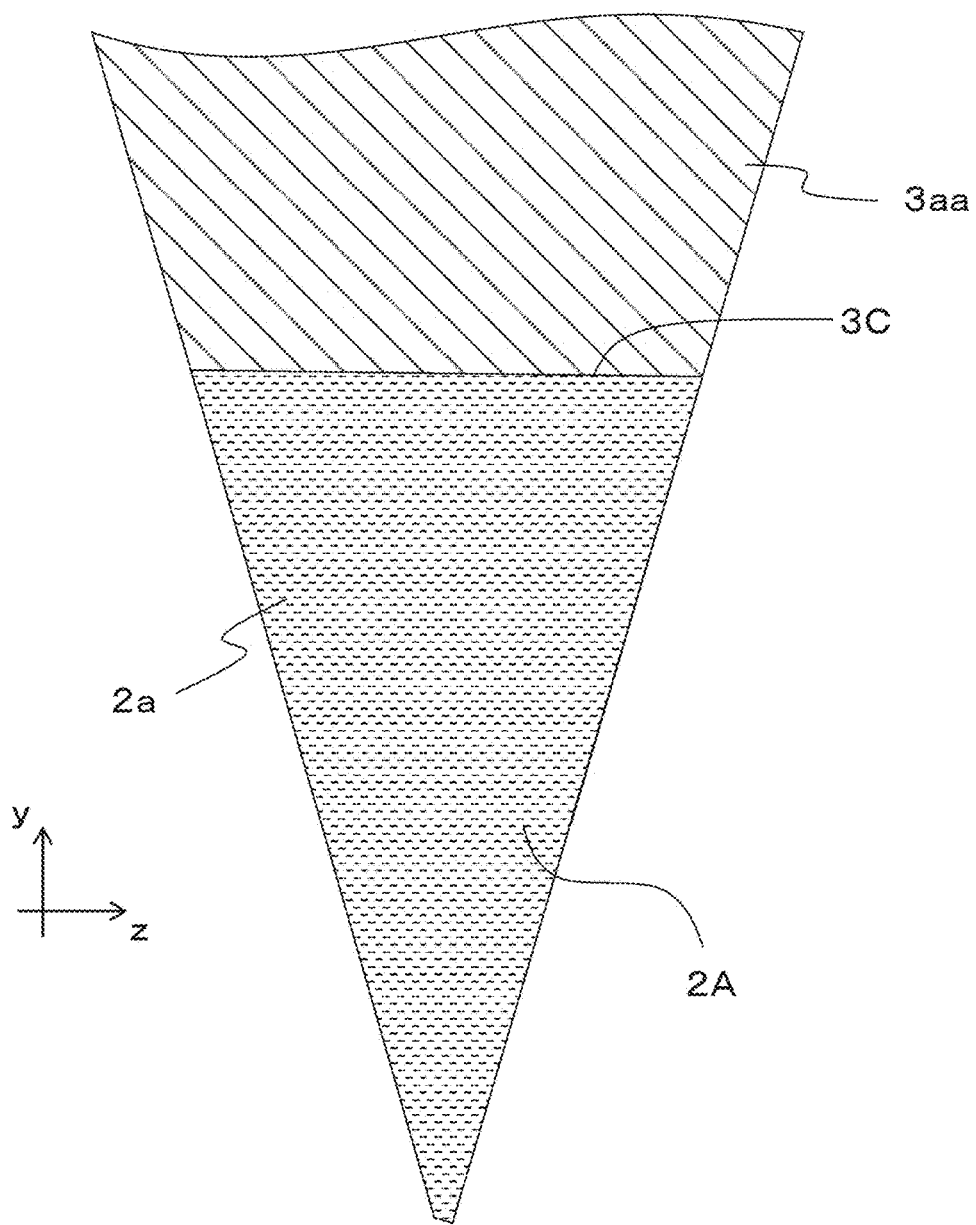
FIG. 13 is a cross-sectional view of a cutter according to another embodiment of the present disclosure.

Next, a cutter 1 that does not include the hard particles 4 in the cutting edge portion 2 is described with reference to FIG. 13. In the cutter 1 illustrated in FIG. 13, the primary component of the base body portion 3 and the primary component of the cutting edge portion 2 are made of the first metal and the second metal 2a, respectively. Vickers hardness of the second metal 2a is set to be less than Vickers hardness of the first metal. Also in this case, the overall strength of the cutter 1 is relatively high due to the first metal, and the occurrence of cracking or chipping in the cutting edge portion 2 can be reduced by the second metal 2a.

Distribution of Vickers Hardness

Figure 14:
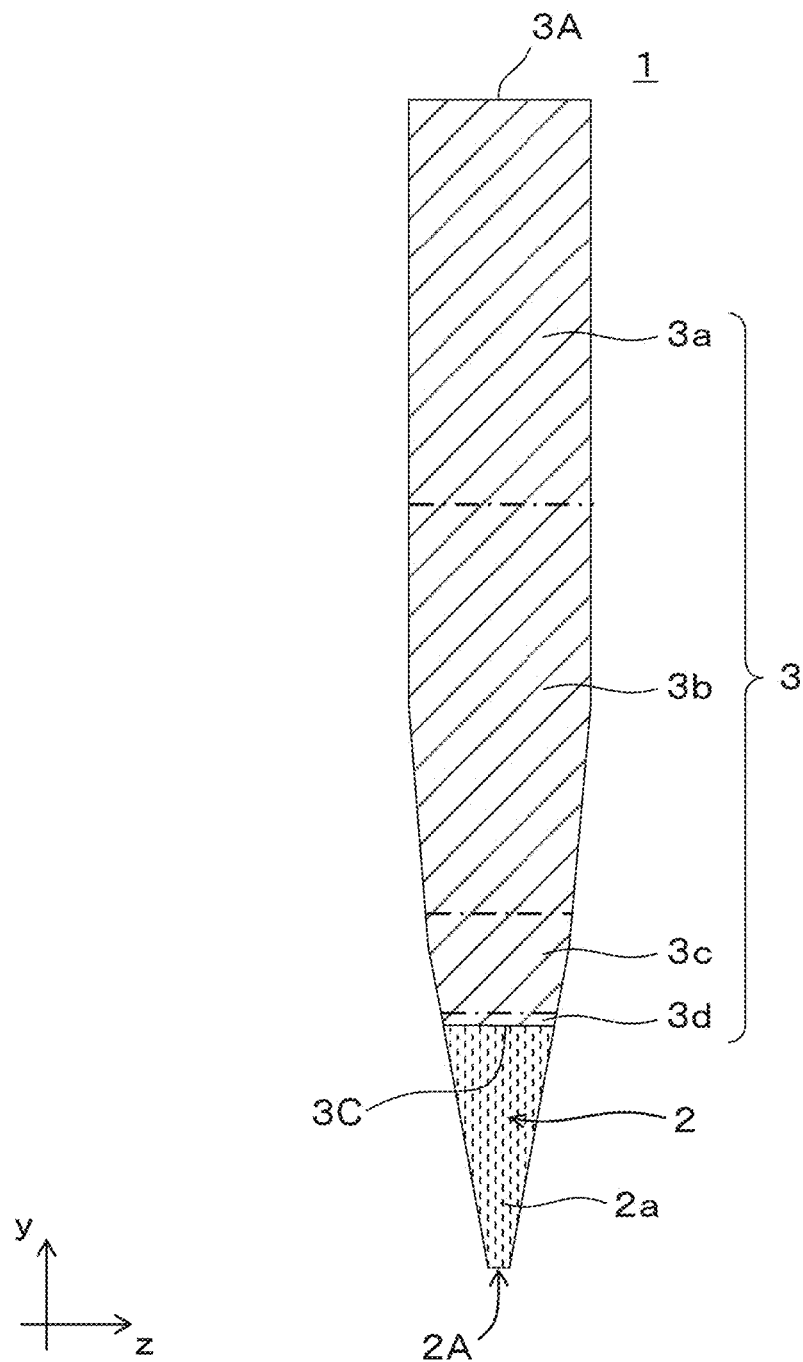
FIG. 14 is a cross-sectional view of the cutter illustrated in FIG. 1 taken along an A-A line.

Distribution of Vickers hardness of the cutter 1 illustrated in FIG. 1 is described. FIG. 14 is a cross-sectional view of the cutter illustrated in FIG. 1 taken along an A-A line. As illustrated in FIG. 14, the exposed portion of the base body portion 3 includes a first region 3a, a second region 3b contiguous with the first region 3a, a third region 3c contiguous with the second region 3b, and a fourth region 3d contiguous with the third region 3c and continued to the cutting edge portion 2 in an order from the back portion 3A to the end portion 3C.

Figure 15:
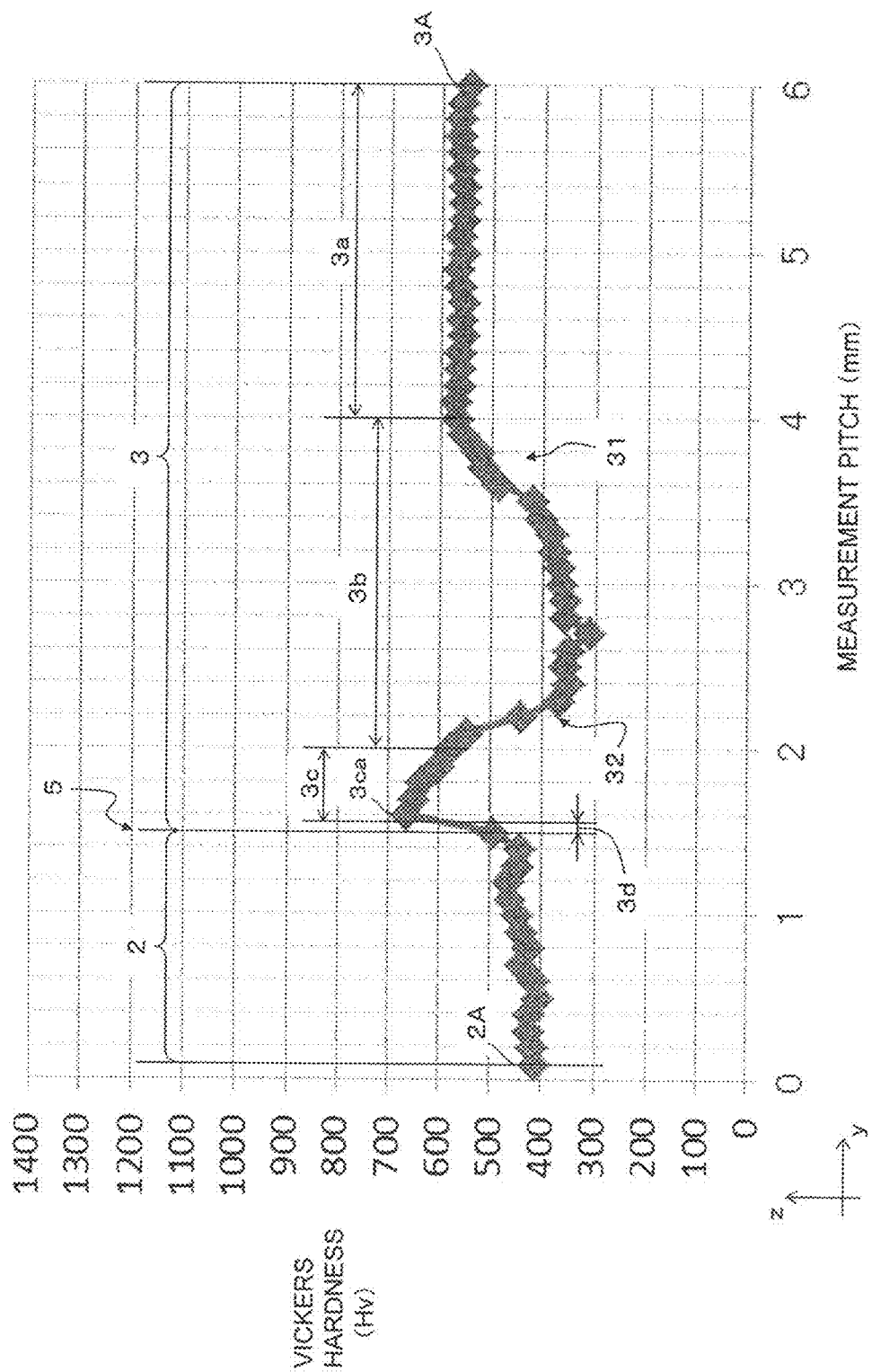
FIG. 15 is a graph showing distribution of Vickers hardness in the cross section illustrated in FIG. 14.

FIG. 15 shows the distribution of Vickers hardness of the base body portion 3. As shown in FIG. 15, the second region 3b has hardness lower than those of the first region 3a and the third region 3c. The third region 3c has Vickers hardness higher than that of the first region 3a.

With these configurations, the second region 3b having Vickers hardness lower than that of the first region 3a is located between the first region 3a and the third region 3c, so that the second region 3b can absorb an impact on the cutting edge portion 2 when an object is cut with the cutter 1. The third region 3c located closer to the cutting edge portion 2 has Vickers hardness higher than that of the first region 3a and the second region 3b, and thus the cutter 1 has high resistance to breakage.

According to FIG. 15, the second region 3b includes a first change portion 31 in which Vickers hardness is gradually decreasing toward the cutting edge 2A and a second change portion 32 in which Vickers hardness is gradually increasing toward the cutting edge 2A.

The first region 3a has a uniform hardness. Here, a uniform hardness refers to a hardness in a range of ±30 Hv with respect to a regression line of the hardness from the back portion 3A to the second region 3b.

Specific Vickers hardness in the first region 3a is in a range of greater than or equal to 500 Hv to less than or equal to 700 Hv. Vickers hardness can be measured by using a method in conformance with JIS Z 2244.

Vickers hardness of the second region 3b is in a range of greater than or equal to 300 Hv to less than 500 Hv, for example. Vickers hardness of the third region 3c is in a range of greater than 500 Hv to less than or equal to 800 Hv, for example. The third region 3c includes a portion 3ca having the highest Vickers hardness in the base body portion 3.

The base body portion 3 includes the fourth region 3d that is located between the third region 3c and the cutting edge portion 2 and has Vickers hardness lower than that of the first region 3a. The fourth region 3d has Vickers hardness lower than that of the first region 3a and higher than that of the cutting edge portion 2. The fourth region 3d has Vickers hardness gradually decreasing as the fourth region 3d is farther away from the third region 3c. The fourth region 3d is in the base body portion 3, so that an abrupt change in hardness of the cutting edge portion 2 is suppressed.

Method for Manufacturing Cutter

Figure 16:
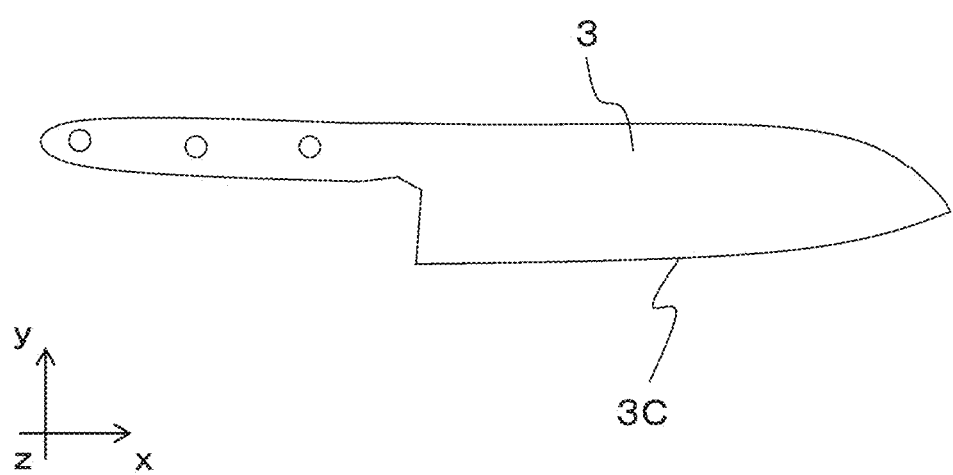
FIG. 16 is a plan view illustrating a method for manufacturing the cutter illustrated in FIG. 1.
Figure 17:
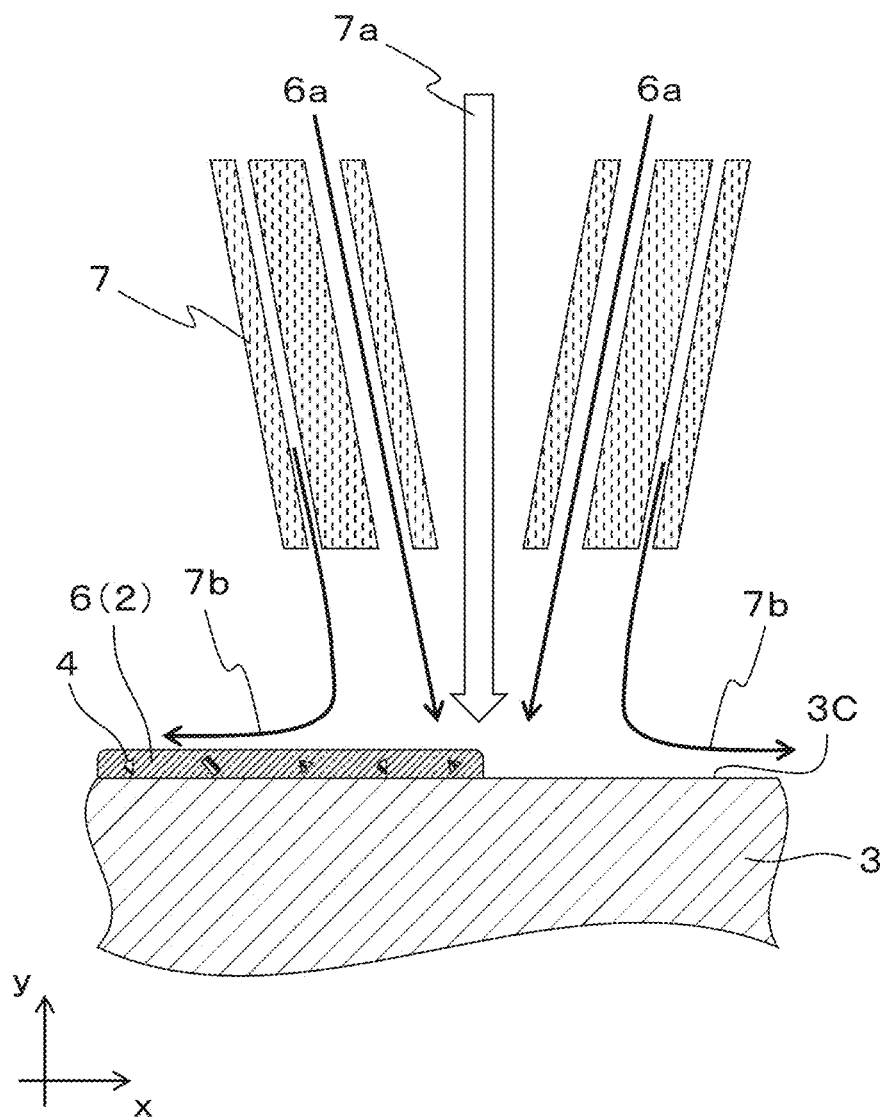
FIG. 17 is a cross-sectional view for explaining a laser cladding technique in the method for manufacturing the cutter illustrated in FIG. 1.

Next, a method for manufacturing the cutter 1 is described with reference to FIGS. 16 to 18. FIGS. 16 to 18 are diagrams for explaining the method for manufacturing the cutter 1 in FIG. 1. The cutter 1 is manufactured in following steps. A step of preparing the base body portion 3 that contains the first metal, a step of preparing metal powder and the hard particles 4 forming the second metal 2a, a step of injecting the metal powder and the hard particles 4 onto the end portion 3C of the base body portion 3 and thermally depositing the metal powder thereon to form an edge member 6 that contains the second metal 2a as the primary component and the plurality of hard particles 4, and a step of polishing the edge member 6 and the base body portion 3 are performed.

First, the base body portion 3 that contains the first metal is prepared. The base body portion 3 has a shape as illustrated in FIG. 16. The base body portion 3 can be prepared by subjecting a stainless-steel sheet to press-forming using a die of a predetermined cuttershape, and quenching is then performed thereon. For quenching, preheating, quenching, and cooling may be performed multiple times. This can increase hardness of the base body portion 3.

For preheating, the base body portion 3 is heated at a temperature lower than that for quenching, which is performed later. This can reduce occurrence of cracking, which is likely to occur at a high temperature for quenching. Conditions for quenching can be appropriately set depending on materials, and may be set to a condition for heating the base body portion 3 at a temperature of higher than or equal to 1000° C., for example. For cooling, the base body portion 3 is rapidly cooled from the temperature for quenching. This can fix the materials, which have been activated in quenching, together.

In addition to the preparation of the base body portion 3, the metal powder and the hard particles 4 forming the second metal 2a are prepared.

Next, the metal powder and the hard particles 4 are injected onto the end portion 3C of the based body portion 3, and the metal powder is thermally deposited on the end portion 3C. Accordingly, the edge member 6 that contains the second metal 2a and the plurality of hard particles 4 is formed.

The metal powder may be melted by a laser for baking. Specifically, a cladding technique with a laser may be used. Specifically, as illustrated in FIG. 17, a cladding material 6a made of the metal powder is supplied to the vicinity of the end portion 3C of the base body portion 3 from sides of laser light 7a in a nozzle 7. This can metallically bond the cladding material 6a, which is a material forming the cutting edge portion 2, to the end portion 3C while melting the cladding material 6a. An inert gas 7b is sprayed onto the end portion 3C from outside the cladding material 6a. This makes it easy for the cladding material 6a to contact the laser light 7a. Argon gas is an example of the inert gas 7a, for example.

Here, the hard particles 4 are mixed when melting the cladding material 6a. Accordingly, the cladding material 6a other than the hard particles 4 is melted by the laser light 7a, to be thereby adhered to the end portion 3C. On the other hand, the hard particles 4 have a high melting point, so that the hard particles 4 are hardly melted by the laser light 7a. Thus, if the hard particles 4 are mixed when melting the cladding material 6a, the plurality of hard particles 4 can be distributed in the cutting edge portion 2.

Figure 18A:
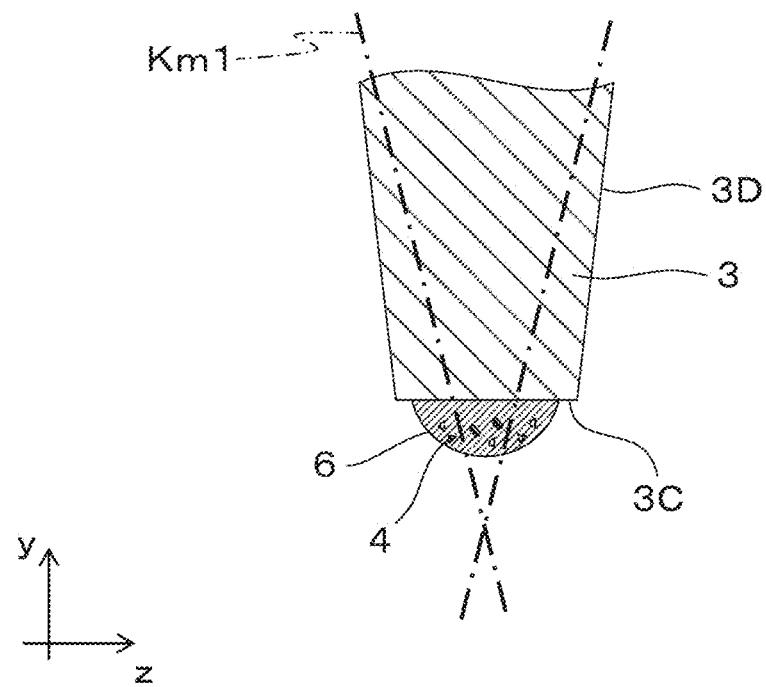
FIGS. 18A and 18B are cross-sectional views of the method for manufacturing the cutter illustrated in FIG. 1.
Figure 18B:
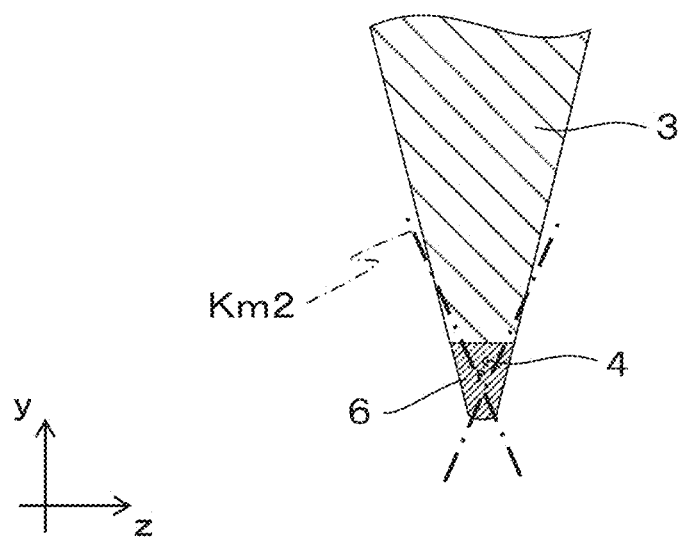

As illustrated in FIGS. 18A and 18B, a part of the edge member 6 is then polished. In the present embodiment, not only the part of the edge member 6 but also a part of the base body portion 3 is polished. Polishing can be performed with an abrasive stone having a surface on which aluminum oxide ($Al_2O_3$), silicon carbide (SiC), diamond, or mixture particles of silicon carbide (SiC) or diamond is applied, for example.

Polishing may be performed multiple times. As illustrated in FIGS. 18A and 18B, first polishing is first performed along a dotted line Km1, and second polishing is then performed along a dotted line Km2.

Conditions for performing quenching on the base body portion 3, conditions for irradiation with laser light, or the like may be adjusted to obtain the base body portion 3 having Vickers hardness as illustrated in FIG. 15. In the above-mentioned manufacturing method, irradiation with laser light is performed after quenching, and thus so-called quenching and annealing on the base body portion 3 are repetitively performed multiple times. The effects of quenching and annealing of the base body portion 3 can be adjusted by adjusting conditions for quenching, conditions for irradiation with laser light, or the like.

Hereinafter, specific descriptions of the present disclosure are given with examples, but the present disclosure is not limited to the examples below.

Example 1

In Example 1, the cutter 1 in which the cutting edge portion 2 contained the hard particles 4 and the end portion 3C was inclined to the z-axis direction was manufactured. Materials that were used are as follows.

Base body portion 3: Stainless steel
Cutting edge portion 2: INCONEL 600
Hard particles 4
Composition: Ceramics containing tungsten carbide as a primary component
Mesh particle diameter: 45 μm
Content in the cutting edge portion 2: 30 vol. %

Figure 19:
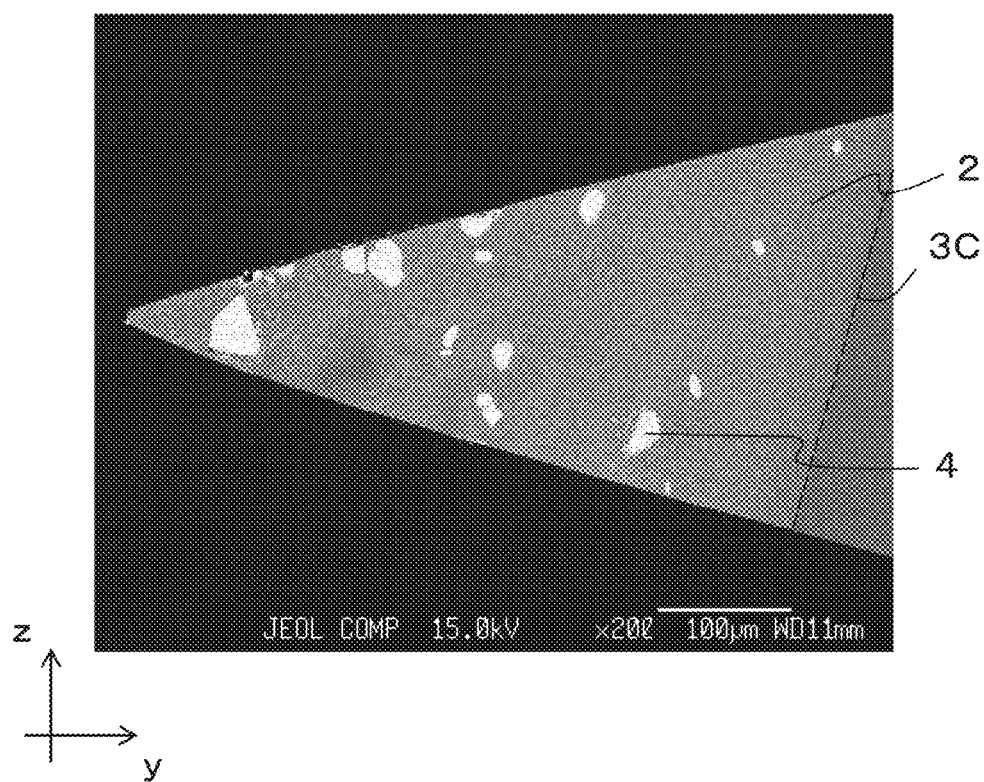
FIG. 19 is an image of a cross section in the vicinity of a cutting end portion of a cutter in an example 1 observed by a scanning electron microscope.

Next, such a cross section obtained by cutting the manufactured cutter 1 parallel to the y-axis direction was examined by a scanning electron microscope. The results are shown in FIG. 19. As clearly seen from the results in FIG. 19, the hard particles 4 were distributed in the cutting edge portion 2 in the cutter 1 of Example 1.

Next, cutting paper test was performed to verify the effects of wear resistance of the cutter 1 in Example 1. The cutting paper test was performed with a Honda-style sharpness testing machine. The cutting paper test tests how many sheets of paper can be cut when a cutter is pressed against 400 sheets of paper with predetermined pressure.

Figure 20:
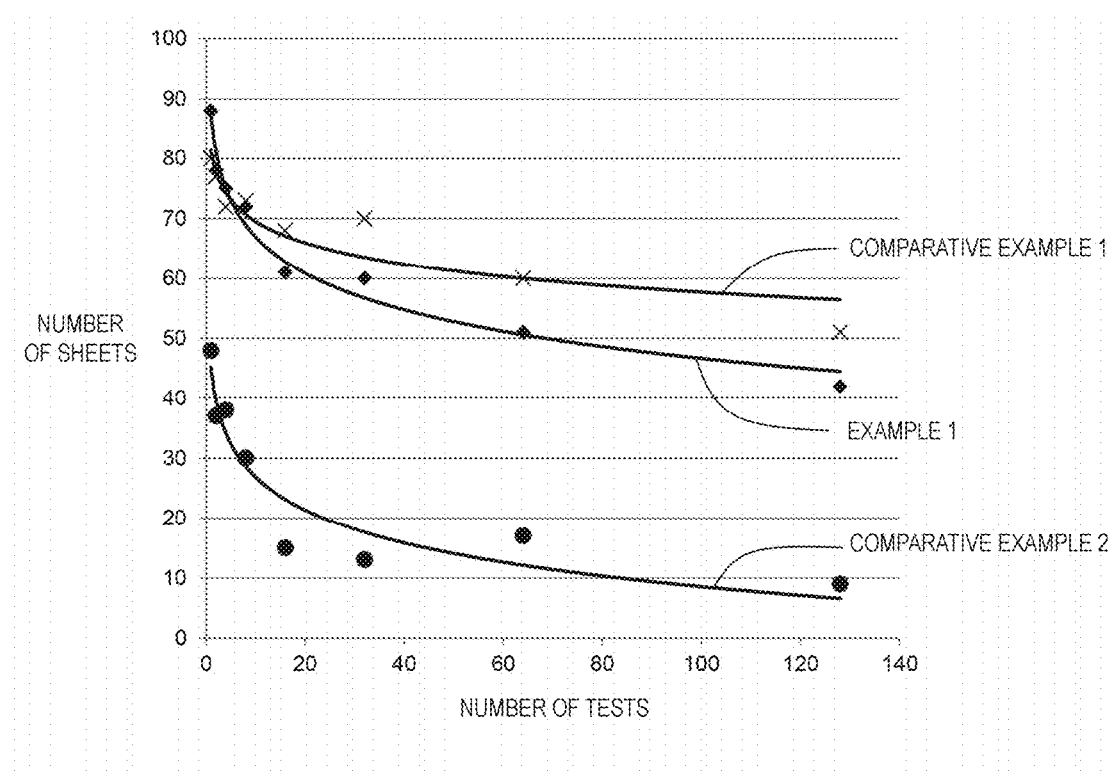
FIG. 20 is a graph showing results of a sharpness test in Example 1.

As comparative examples, a cutter including a blade body entirely made of zirconia (Comparative Example 1) and a cutter including a blade body entirely made of stainless steel (Comparative Example 2) were prepared, and the cutting paper test was performed under the same conditions as those of Example 1. The results are shown in FIG. 20. In FIG. 20, the horizontal axis shows how many times the cutting paper test was performed, and the vertical axis shows how many sheets of paper were cut in one cutting paper test.

As a result, it was found out that the cutter in Example 1 had initial sharpness higher than that of the cutter made of stainless steel in Comparative Example 2, and its sharpness did not greatly deteriorate. Also, it was found out that the cutter in Example 1 had initial sharpness higher than that of the cutter made of ceramics in Comparative Example 1. Furthermore, a life of the sharpness in Example 1 was close to that in Comparative Example 1.

Therefore, it was clear that the initial sharpness and the life of the sharpness in Example 1 were close to those in Comparative Example 1 and better than those in Comparative Example 2.

Example 2

In Example 2, the cutter 1 in which the cutting edge portion 2 contained the plurality of hard particles 4 and the end portion 3C was inclined to the z-axis direction was manufactured. Materials that were used are as follows.
Base body portion 3: Stainless steel
Cutting edge portion 2: INCONEL 600
Hard particles 4
Composition: Ceramics containing tungsten carbide as a primary component
Mesh particle diameter: 25 μm
Content in the cutting edge portion 2: 30 vol. %

Figure 21A:
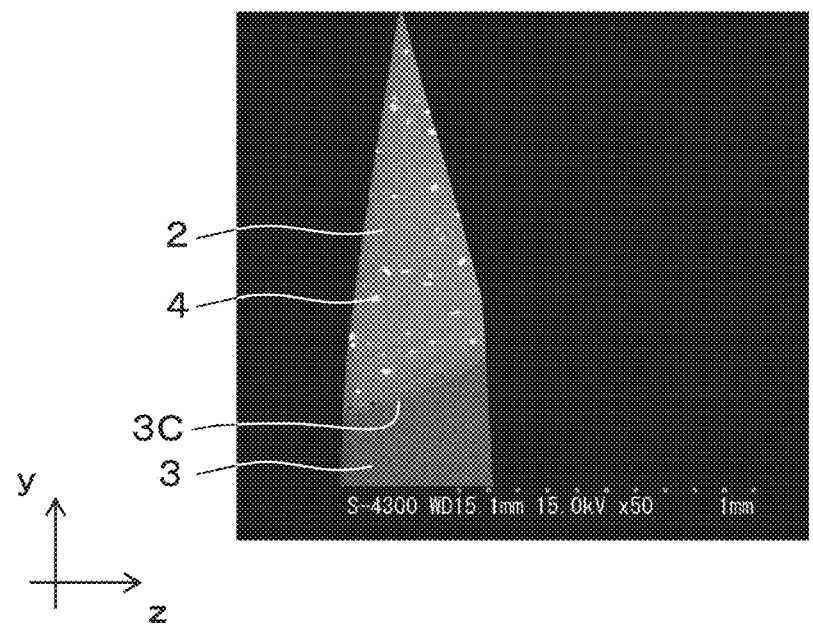
FIGS. 21A and 21B are images of a cutter in Example 2.

The manufactured cutter 1 was cut parallel to the y-axis direction, and its cross section was examined by the scanning electron microscope. The results are shown in FIG. 21A. As clearly seen from FIG. 21A, the hard particles 4 were distributed in the cutting edge portion 2.

Figure 21B:
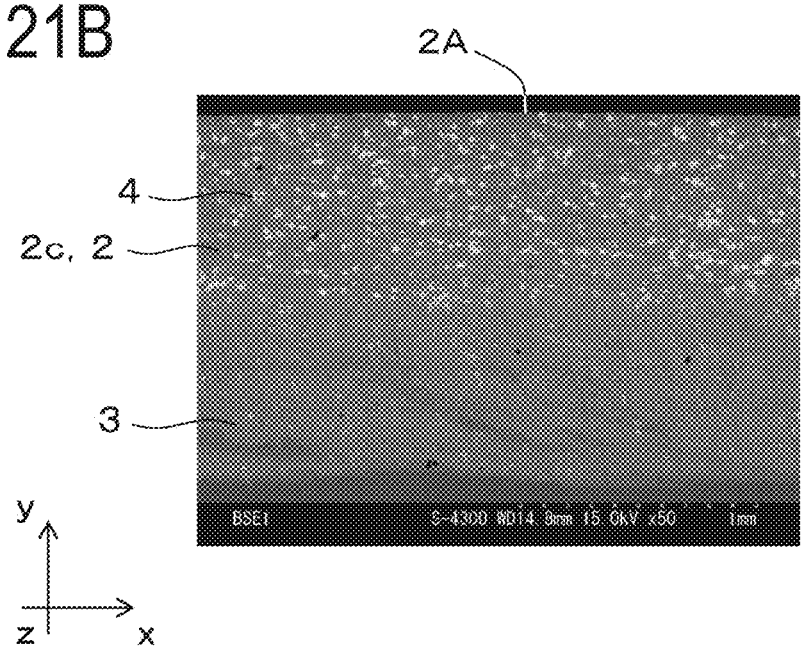

A side surface in the vicinity of the cutting edge portion 2 of the manufactured cutter 1 was examined by the scanning electron microscope. The results are shown in FIG. 21B. As clearly seen from FIG. 21B, the plurality of hard particles 4 were exposed from the side surface 2c of the cutting edge portion 2 in the manufactured cutter 1. It is also clear that the plurality of hard particles 4 were exposed from the cutting edge 2A.

Example 3

Investigation of Laser Cladding Composition

In Example 3, suitable percentages of the metal material (second metal) and the hard particles forming the cutting edge portion were investigated. In other words, the same cutting paper test as that in Example 1 was performed for various cutting edge portions manufactured by changing the percentages of both. Samples that were used in the test are as follows. The percentages (vol. %) of the metal material (second metal) and the hard particles in the cutting edge portion are as follows.
Example 3-1 Metal material:hard particles=75:25
Example 3-2 Metal material:hard particles=81:19
Example 3-3 Metal material:hard particles=86:14
Example 3-4 Metal material:hard particles=90:10
Example 3-5 Metal material:hard particles=94:6
For comparison, the cutter made of stainless steel (SUS420J2) (Comparative Example) was manufactured.

Figure 22A:
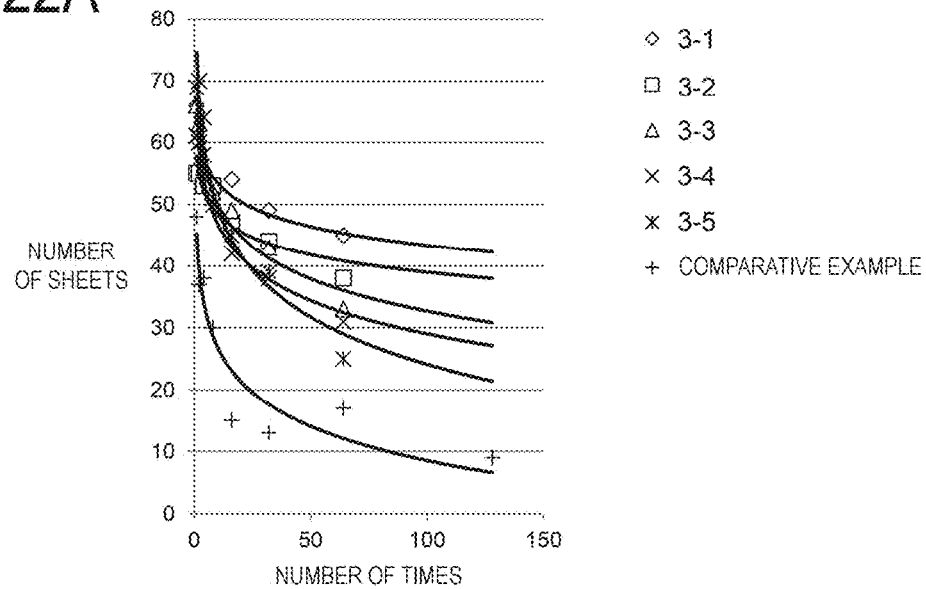
FIG. 22A is a graph showing results of a cutting paper test in an example 3.
Figure 22B:
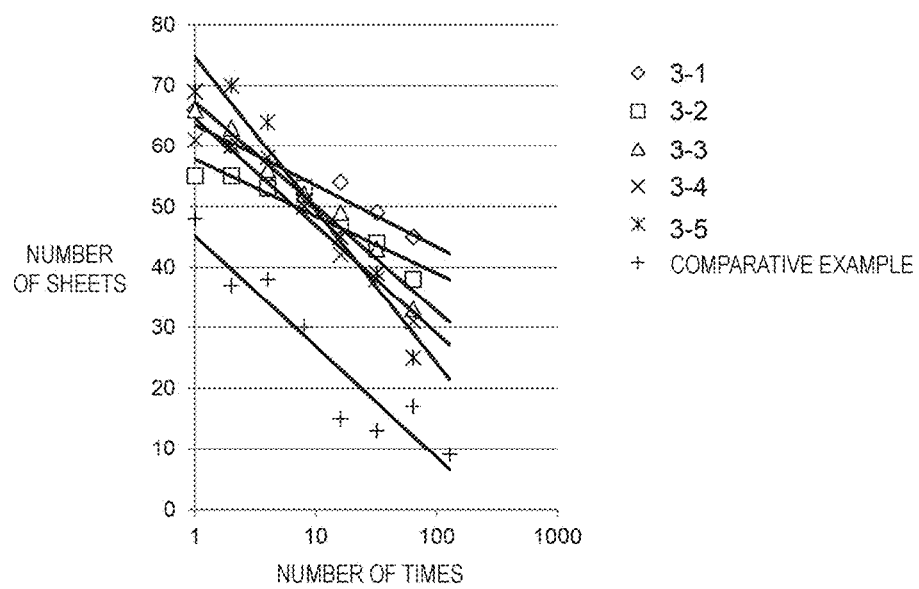
FIG. 22B is a graph plotting the test results in the graph of FIG. 22A on a logarithmic scale.

The test results are shown in FIG. 22A. FIG. 22B plots the number of cutting paper tests shown in FIG. 22A in the horizontal axis with a logarithmic straight line. The logarithmic straight line makes it clear to show the deterioration of the cutting edge portion.

As clearly seen from FIG. 22B, all Examples 3-1 to 3-5 had durability higher than that of Comparative Example. It is also clear that Example 3-5 relatively quickly deteriorated, Examples 3-3, 3-4 had a gentle inclination of the straight line, and Examples 3-1, 3-2 had more gentle inclination than that of Comparative Example, so that the durability was improved.

Example 4

The same cutter as that in Example 2 was manufactured except that Ni-based COLMONOY was used instead of the material (INCONEL 600) for the cutting edge portion 2 used in Example 2. The plurality of hard particles 4 were exposed from the side surfaces 2c and the cutting edge 2A of the cutting edge portion 2 of the cutter. The cutting edge portion 2 has Vickers hardness of about 450 Hv after annealing.

Table 1 shows the composition of the Ni-based COLMONOY used.

TABLE 1

| Component | Content (mass %) |
| --- | --- |
| Carbon | 0.03 |
| Iron | 0.23 |
| Silicon | 2.75 |
| Boron | 1.85 |
| Oxygen | 0.044 |
| Nickel | Remainder |

Example 5

The cutter 1 in which the cutting edge portion 2 contained the plurality of hard particles 4 and the end portion 3C of the base body portion 3 was inclined to the z-axis direction was manufactured. Materials that were used are as follows.
Base body portion 3: Stainless steel
Cutting edge portion 2: INCONEL 600
Hard particles 4
Composition: Ceramics containing tungsten carbide as a primary component
Mesh particle diameter: 45 μm
Content in the cutting edge portion 2: 30 vol. %

Next, the distribution of Vickers hardness of the manufactured cutter 1 was measured. Specifically, first, the cutter 1 was cut in a direction parallel to the cutting edge direction (y-axis direction) of the cutting edge portion 2, which was perpendicular to the x-axis direction. The cut portion was a portion corresponding to the A-A line in FIGS. 1 and 2.

Vickers hardness was then measured by a method in conformance with JIS Z 2244 from the cutting edge 2A to the back portion 3A in the cross section of the cut portion. Measurement conditions are as follows.
Test force: 5 kg
Measurement pitch: 0.5 mm The measurement results are shown in FIG. 15. As clearly seen from FIG. 15, the base body portion 3 of the cutter 1 had the first region 3a, the second region 3b, the third region 3c, and the fourth region 3d as described above.

Figure 23:
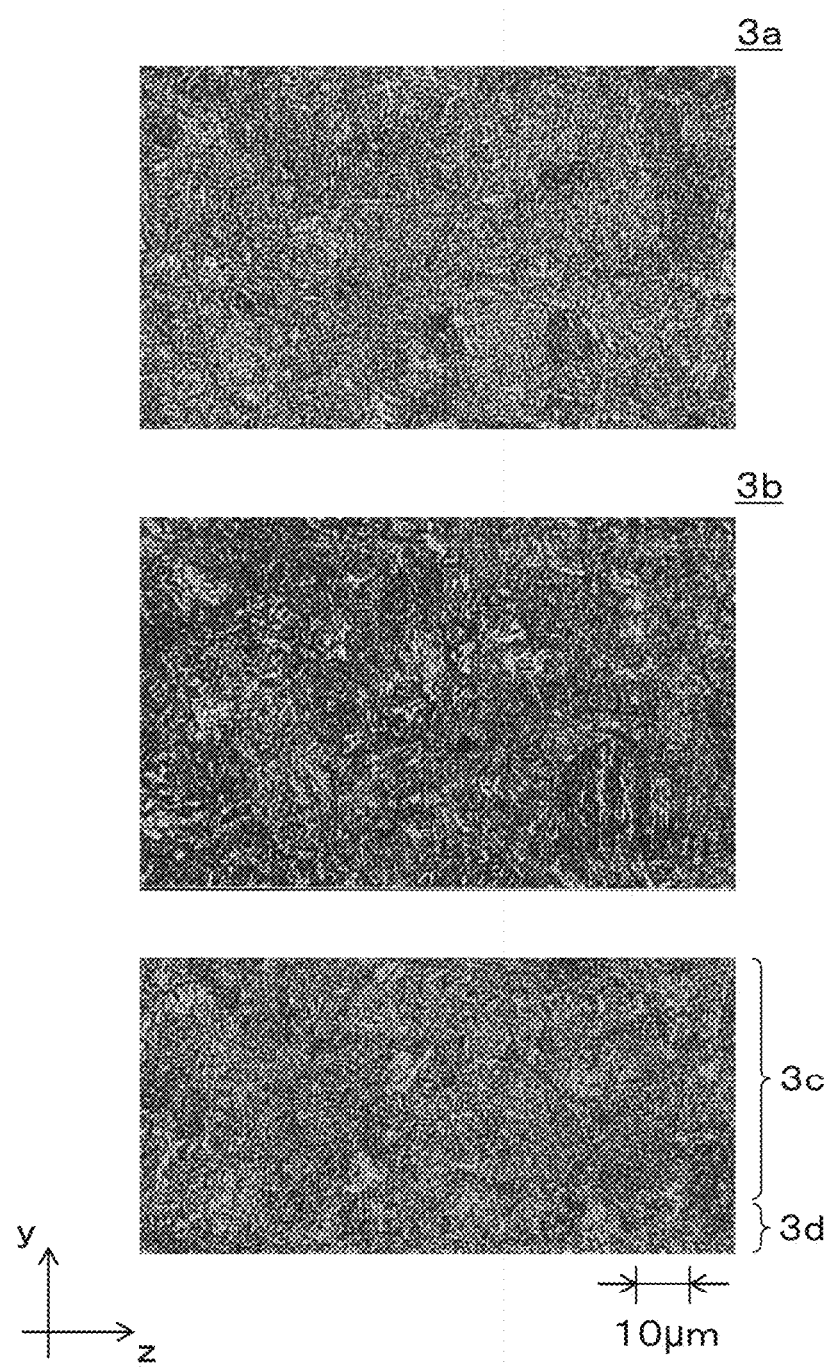
FIG. 23 is an image of a cutter in Example 5.

The manufactured cutter 1 was then cut in parallel to the y-axis direction, and its cross section was observed by the scanning electron microscope. The results are shown in FIG. 23. As clearly seen from FIG. 23, coarse crystals due to "annealing (100° C. to 200° C.)" in the second region 3b were observed. It was presumed that the second region 3b had Vickers hardness lower than that of the first region 3a due to "annealing". In the third region 3c, closely-packed recrystallization due to "annealing (1150° C. to 1200° C.)" occurred, and aggregation and densification of the crystals were observed. It was presumed that the third region 3c had Vickers hardness higher than that of the first region 3a due to "quenching". It was presumed that the fourth region 3d had Vickers hardness lower than that of the first region 3a due to mixing of compositions and alloying by heat dispersion.

The present disclosure has been described with the embodiments described above, but it should not be understood that the present disclosure is limited to the discussion and the drawings that form a part of this disclosure.

REFERENCE SIGNS LIST

1 Cutter
1a Blade body
1b Handle
2 Cutting edge portion
2a Second metal
2A Cutting edge
2c Side surface
3 Base body portion
3a First region
3b Second region
3c Third region
3d Fourth region
3A Back portion
3C End portion
4 Hard particles
6 Edge member
α First inclined region
β Second inclined region

What is claimed is:

1. A cutter, comprising a blade body that comprises a base body portion and a cutting edge portion disposed along an end portion of the base body portion and connected to the end portion, wherein
the base body portion comprises a first metal;
the cutting edge portion comprises a second metal and a plurality of hard particles having a hardness higher than that of the second metal and
the cutting edge portion comprises a cutting edge and a pair of side surfaces located on both sides of the cutting edge, and at least one of the hard particles is exposed from the side surfaces;
the cutting edge portion further comprises a base body region and a cutting edge region, the base body region being closer to the base body portion than the cutting edge region;
a ratio of an area of the hard particles that are selectively exposed from the second metal of the side surfaces of the cutting edge portion is higher in the cutting edge region than the blade body region;
the base body portion comprises the end portion and a back portion and
the base body portion comprises a first region, a second region, and a third region in consecutive order from the back portion to the cutting edge portion;
the second region has hardness lower than those of the first region and the third region, and
the third region has hardness higher than that of the first region; and
the base body portion comprises a fourth region located between the third region and the cutting edge portion and has hardness lower than that of the first region and has hardness gradually decreasing from the third region toward the cutting edge portion.

2. The cutter according to claim 1, wherein at least one of the hard particles is exposed from the cutting edge.

3. The cutter according to claim 1, wherein the at least one of the hard particles comprises a recessed portion in an exposed surface.

4. The cutter according to claim 1, wherein
the side surfaces of the blade body each comprise a first inclined region inclined to a vertical direction at a first inclination angle and a second inclined region inclined to the vertical direction at a second inclination angle smaller than the first inclination angle,
the first inclined region is located closer to a cutting edge side than the second inclined region is, and
the cutting edge portion comprises a whole of the first inclined region and a part of the second inclined region.

5. The cutter according to claim 1, wherein the second metal comprises a metal material having hardness lower than that of the first metal.

6. The cutter according to claim 1, wherein an entirety of the end portion of the base body portion is in a planar surface.

7. The cutter according to claim 6, wherein the flat surface of the end portion of the base body portion is parallel to a horizontal direction.

8. The cutter according to claim 1, wherein the end portion of the base body portion is a convex curved surface.

9. The cutter according to claim 1, wherein the cutting edge portion comprises greater than or equal to 10 vol. % and less than or equal to 50 vol. % of the hard particles exposed from the side surfaces of the cutting edge portion.

10. The cutter according to claim 1, wherein the third region comprises a portion having a highest hardness in the base body portion.

11. The cutter according to claim 1, wherein the cutting edge portion is connected to the fourth region.

12. A cutter, comprising a blade body that comprises a base body portion and a cutting edge portion disposed along an end portion of the base body portion and connected to the end portion, wherein
the base body portion comprises a first metal;
the cutting edge portion comprises a second metal having a hardness lower than that of the first metal and a plurality of hard particles having hardness higher than that of the second metal and
the cutting edge portion comprises a cutting edge and a pair of side surfaces located on both sides of the cutting edge, and at least one of the hard particles is exposed from the side surfaces;
the cutting edge portion further comprises a base body region and a cutting edge region, the base body region being closer to the base body portion than the cutting edge region and the cutting edge portion is connected at an interface to the base body portion, an entirety of the interface being in a planar surface; and
a ratio of an area of the hard particles exposed from the side surfaces of the cutting edge portion is higher in the cutting edge region than the blade body region.

13. The cutter according to claim 12, wherein the plurality of hard particles are distributed in a length direction, a width direction, and a thickness direction of the base body portion.

14. A cutter, comprising a blade body that comprises a base body portion and a cutting edge portion disposed along an end portion of the base body portion and connected to the end portion, wherein the base body portion comprises a first metal;

the cutting edge portion comprises a second metal and a plurality of hard particles having a hardness higher than that of the second metal and the base body portion comprises the end portion and a back portion and the base body portion comprises a first region, a second region, a third region, and a fourth region in consecutive order, non-overlapping from the back portion to the cutting edge portion;

the second region has a hardness lower than those of the first region and the third region, and the third region has a hardness higher than an entirety of the first region; and the fourth region having a hardness lower than an entirety of the first region.

15. The cutter according to claim 14, wherein the first region has a uniform hardness.

16. The cutter according to claim 14, wherein the second region comprises: a first change portion with a hardness gradually decreasing toward a cutting edge of the cutting edge portion and a second change portion with a hardness gradually increasing toward the cutting edge of the cutting edge portion.

17. The cutter according to claim 14, wherein the third region comprises a portion having a highest hardness in the base body portion.

18. The cutter according to claim 14, wherein the fourth region has hardness gradually decreasing from the third region toward the cutting edge portion.

19. The cutter according to claim 14, wherein the cutting edge portion is contiguous with the fourth region.

* * * * *